United States Patent
Aizu et al.

(10) Patent No.: US 10,675,903 B2
(45) Date of Patent: Jun. 9, 2020

(54) PLANOGRAPHIC PRINTING PLATE PRECURSOR AND PLATE-MAKING METHOD FOR PLANOGRAPHIC PRINTING PLATE

(71) Applicant: FUJIFILM CORPORATION, Minato-ku, Tokyo (JP)

(72) Inventors: Kohei Aizu, Shizuoka (JP); Ryo Nakamura, Shizuoka (JP); Hiroaki Idei, Shizuoka (JP); Tomoki Ochimizu, Shizuoka (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 16/109,774

(22) Filed: Aug. 23, 2018

(65) Prior Publication Data

US 2018/0361774 A1   Dec. 20, 2018

Related U.S. Application Data

(63) Continuation of application No. PCT/JP2017/003242, filed on Jan. 30, 2017.

(30) Foreign Application Priority Data

Feb. 29, 2016  (JP) .................. 2016-036966

(51) Int. Cl.
| | |
|---|---|
| B41N 1/14 | (2006.01) |
| G03F 7/30 | (2006.01) |
| B41C 1/10 | (2006.01) |
| G03F 7/033 | (2006.01) |
| B41M 1/00 | (2006.01) |
| B41M 1/06 | (2006.01) |
| B41M 5/26 | (2006.01) |

(52) U.S. Cl.
CPC ............. *B41N 1/14* (2013.01); *B41C 1/1008* (2013.01); *B41M 1/00* (2013.01); *B41M 1/06* (2013.01); *B41M 5/26* (2013.01); *G03F 7/033* (2013.01); *G03F 7/30* (2013.01); *G03F 7/3035* (2013.01)

(58) Field of Classification Search
None
See application file for complete search history.

(56) References Cited

U.S. PATENT DOCUMENTS

| | | |
|---|---|---|
| 2005/0003285 A1 | 1/2005 | Hayashi et al. |
| 2005/0009954 A1 | 1/2005 | Gebhard et al. |
| 2008/0072780 A1 | 3/2008 | Sonokawa et al. |
| 2011/0053085 A1 | 3/2011 | Huang et al. |
| 2013/0344444 A1 | 12/2013 | Sonokawa |
| 2015/0000544 A1 | 1/2015 | Shiraki et al. |

FOREIGN PATENT DOCUMENTS

| | | |
|---|---|---|
| CN | 1576334 A | 2/2005 |
| CN | 103403623 A | 11/2013 |
| CN | 104203588 A | 12/2014 |
| EP | 1685957 A2 | 8/2006 |
| EP | 1849836 A2 | 10/2007 |
| EP | 2168766 A1 | 3/2010 |
| EP | 2363748 A1 | 9/2011 |
| EP | 2383118 A2 | 11/2011 |
| EP | 2680074 A1 | 1/2014 |
| JP | 2008-80644 A | 4/2008 |
| JP | 2011-161872 A | 8/2011 |
| JP | 2013-503365 A | 1/2013 |
| WO | 2006/007270 A1 | 1/2006 |

OTHER PUBLICATIONS

Extended European Search Report dated Oct. 12, 2018, issued in corresponding EP Patent Application No. 17759510.5.
International Search Report issued in International Application No. PCT/JP2017/003242 dated Apr. 11, 2017.
Written Opinion of the ISA issued in International Application No. PCT/JP2017/003242 dated Apr. 11, 2017.
English language translation of the following: Office action dated Jul. 12, 2019 from the SIPO in a Chinese patent application No. 201780013354.1 corresponding to the instant patent application. This office action translation is submitted now in order to supplement the understanding of the cited references which are being disclosed in the instant Information Disclosure Statement.
English language translation of the following: Office action dated Mar. 13, 2020 from the SIPO in a Chinese patent application No. 201780013354.1 corresponding to the instant patent application.

*Primary Examiner* — Joshua D Zimmerman

(74) *Attorney, Agent, or Firm* — Solaris Intellectual Property Group, PLLC

(57) ABSTRACT

Provided are a planographic printing plate precursor including: a support; and an image recording layer provided on the support, in which the image recording layer contains an infrared absorbing agent, a polymerization initiator, a polymerizable compound containing a hydrogen bonding group, and a hard polymer particle containing at least one group selected from the group consisting of a urethane group, a urea group, an imide group, an amide group, and a sulfonamide group on the surface of the hard polymer particle, and a number average primary particle diameter of the hard polymer particle is in a range of 0.01 to 1 μm; and a plate-making method for a planographic printing plate obtained by using the planographic printing plate precursor.

6 Claims, No Drawings

PLANOGRAPHIC PRINTING PLATE PRECURSOR AND PLATE-MAKING METHOD FOR PLANOGRAPHIC PRINTING PLATE

CROSS-REFERENCE TO RELATED APPLICATIONS

This application is a continuation application of International Application No. PCT/JP2017/003242, filed Jan. 30, 2017, the disclosure of which is incorporated herein by reference in its entirety. Further, this application claims priority from Japanese Patent Application No. 2016-036966, filed Feb. 29, 2016, the disclosure of which is incorporated herein by reference in its entirety.

BACKGROUND OF THE INVENTION

1. Field of the Invention

The present invention relates to a planographic printing plate precursor and a plate-making method for a planographic printing plate.

2. Description of the Related Art

As a solid-state laser, a semiconductor laser, and a gas laser which emit ultraviolet light, visible light, and infrared light, respectively, having a wavelength of 300 nm to 1,200 nm, small-sized and high-output lasers can be easily obtained in the field of a planographic printing plate precursor, and these lasers are extremely useful as recording light sources during direct plate-making from digital data of a computer and the like. Various research on recording materials sensitive to various laser beams has been conducted. As representative examples, firstly, a positive type recording material and a negative type recording material are exemplified as materials which can perform recording with an infrared laser having an image recording wavelength of 760 nm or greater. Secondly, a radical polymerization type negative type recording material is exemplified as a recording material compatible with an ultraviolet light laser or a visible light laser having a wavelength of 300 nm to 700 nm.

In addition, from the growing interest in the global environment, environmental issues related to a waste liquid associated with wet treatments such as a development treatment have been criticized.

In regard to the above-described environmental issues, it is desired to simplify a development treatment or a plate-making treatment or not to perform any treatment. As a simple plate-making method, a method referred to as "on-press development" has been performed. In other words, the on-press development is a method of exposing a planographic printing plate precursor, mounting the planographic printing plate precursor on a printing press without performing development of the related art, and then removing an unnecessary portion of an image recording layer, at an initial stage of a typical printing step.

For example, WO2006/007270A describes, as an image-formable element or a planographic printing plate precursor which is capable of on-press development, an image formable element which includes a planographic substrate; and a polymer binder containing a radical polymerizable component (a), an initiator system (b) capable of generating radicals sufficient to initiate a polymerization reaction when exposed to radiation for forming an image, a hydrophobic main chain (c), and both of a constitutional unit (i) that contains a pendant-cyano group directly bonded to the hydrophobic main chain and a constitutional unit (ii) that contains a pendant group having a hydrophilic poly(alkylene oxide) segment.

SUMMARY OF THE INVENTION

The present inventors found that the planographic printing plate precursor described in WO2006/007270A has a problem in that the image recording layer has poor scratch resistance during printing.

Further, the present inventors found that the planographic printing plate precursor described in WO2006/007270A has a problem in that the scratch resistance of an image area in the image recording layer deteriorates during printing after plate-making as a planographic printing plate particularly in a case where an external load such as a vibration is applied in a state of the planographic printing plate precursor.

The reason for this is assumed that, since the affinity between polymer particles such as polymer binder and surrounding materials such as a monomer is low, desorption of polymer particles is likely to occur in the planographic printing plate precursor and scratches are generated on the image recording layer due to the desorbed polymer particles.

In addition, it is assumed that desorption of the polymer particles at the time of printing is more likely to occur after plate-making due to the load such as vibration in the state of the planographic printing plate precursor.

An object to be solved by an embodiment of the present invention is to provide a planographic printing plate precursor from which a planographic printing plate with excellent scratch resistance and printing durability is obtained and a plate-making method for a planographic printing plate obtained by using the planographic printing plate precursor.

The above-described problems of the present invention are solved by means described in the following item <1> or <5>. The item <1> or <5> will be described below together with the items <2> to <4> which are preferred embodiments.

<1> A planographic printing plate precursor comprising: a support; and an image recording layer provided on the support, in which the image recording layer contains an infrared absorbing agent, a polymerization initiator, a polymerizable compound containing a hydrogen bonding group, and a hard polymer particle containing at least one group selected from the group consisting of a urethane group, a urea group, an imide group, an amide group, and a sulfonamide group on the surface of the hard polymer particle, and a number average primary particle diameter of the hard polymer particle is in a range of 0.01 to 1 µm.

<2> The planographic printing plate precursor according to <1>, in which a polymer constituting the hard polymer particle includes a polymer having any one or both of a monomer unit derived from a styrene compound and a monomer unit derived from a (meth)acrylonitrile compound.

<3> The planographic printing plate precursor according to <2>, in which the polymer further has a monomer unit derived from a poly(ethylene glycol) alkyl ether methacrylate compound.

<4> The planographic printing plate precursor according to any one of <1> to <3>, which is used for on-press development.

<5> A plate-making method for a planographic printing plate comprising, in order: a step of imagewise-exposing the planographic printing plate precursor according to any one of <1> to <4>; and a step of supplying at least one of a printing ink or dampening water and removing an unexposed portion of an image recording layer in the planographic printing plate precursor.

According to the embodiments of the present invention, it is possible to provide a planographic printing plate precursor from which a planographic printing plate with excellent scratch resistance and printing durability is obtained and a plate-making method for a planographic printing plate obtained by using the planographic printing plate precursor.

DESCRIPTION OF THE PREFERRED EMBODIMENTS

Hereinafter, the contents of the present invention will be described in detail. The description of constituent elements below is made based on representative embodiments of the present invention in some cases, but the present invention is not limited to such embodiments. Further, in the present specification, the numerical ranges shown using "to" indicate ranges including the numerical values described before and after "to" as the lower limit values and the upper limit values.

In the present specification, in a case where substitution or unsubstitution is not noted in regard to the notation of a "group" in a compound represented by a general formula, and the "group" may further include a substituent, the group includes not only an unsubstituted group but also a substituent unless otherwise specified. For example, in a general formula, the description "R represents an alkyl group, an aryl group, or a heterocyclic group" means "R represents an unsubstituted alkyl group, a substituted alkyl group, an unsubstituted aryl group, a substituted aryl group, an unsubstituted heterocyclic group, or a substituted heterocyclic group".

Further, in the present specification, "(meth)acrylamide" indicates any one or both of methacrylamide and acrylamide. The same applies to the description of (meth)acrylate, (meth)acryloyl, (meth)acrylic acid, (meth)acryloxy, (meth)acrylonitrile, or the like.

Further, in the present invention, "% by mass" has the same definition as that for "% by weight", and "part by mass" has the same definition as that for "part by weight".

Further, in the present invention, a combination of two or more preferred aspects is a more preferred aspect.

(Planographic Printing Plate Precursor)

A planographic printing plate precursor according to the present disclosure includes a support; and an image recording layer, in which the image recording layer contains an infrared absorbing agent, a polymerization initiator, a polymerizable compound containing a hydrogen bonding group, and hard polymer particles containing at least one group selected from the group consisting of a urethane group, a urea group, an imide group, an amide group, and a sulfonamide group on the surface thereof, and the number average primary particle diameter of the hard polymer particles is in a range of 0.01 to 1 µm.

It is preferable that the planographic printing plate precursor according to the present disclosure is used for on-press development.

The present inventors found that a planographic printing plate with excellent printing durability and scratch resistance is obtained from a planographic printing plate precursor including a support; and an image recording layer, in which the image recording layer contains an infrared absorbing agent, a polymerization initiator, a polymerizable compound containing a hydrogen bonding group, and hard polymer particles containing at least one group selected from the group consisting of a urethane group, a urea group, an imide group, an amide group, and a sulfonamide group on the surface thereof, and the number average primary particle diameter of the hard polymer particles is in a range of 0.01 to 1 µm.

Further, the present inventors found that the scratch resistance of an image area in the image recording layer during printing is excellent after plate-making as a planographic printing plate even in a case where external stimulation such as vibration is applied to the planographic printing plate precursor according to the present disclosure.

The detailed mechanism for obtaining the printing durability and the scratch resistance is not clear, but it is assumed that, since the affinity between hard polymer particles in the image recording layer and surrounding materials such as a polymerizable compound is high, desorption of hard polymer particles is suppressed, the printing durability is improved, generation of scratches on an image area due to the desorbed hard polymer particles is suppressed, and the scratch resistance is improved.

<Image Recording Layer>

The image recording layer of the present disclosure contains an infrared absorbing agent, a polymerization initiator, a polymerizable compound containing a hydrogen bonding group, and hard polymer particles containing at least one group selected from the group consisting of a urethane group, a urea group, an imide group, an amide group, and a sulfonamide group on the surface thereof, and the number average primary particle diameter of the hard polymer particles is in a range of 0.01 to 1 µm.

[Infrared Absorbing agent]

The image recording layer used in the present disclosure contains an infrared absorbing agent.

The infrared absorbing agent used here is assumed to be an agent which enters an electron excited state with high sensitivity with respect to irradiation (exposure) with an infrared laser and in which electron transfer, energy transfer, heat generation (photothermal conversion function), or the like associated with such an electron excited state acts on a polymerization initiator coexisting in the image recording layer so that chemical change occurs in the polymerization initiator to generate radicals. The addition of an infrared absorbing agent is particularly suitable for plate-making which is directly drawn by infrared laser light having a maximum wavelength in a wavelength range of 750 to 1,400 nm and a planographic printing plate precursor including an image recording layer to which an infrared absorbing agent has been added is capable of exhibiting higher image formability compared to a planographic printing plate precursor of the related art.

It is preferable that the infrared absorbing agent used in the present disclosure has maximum absorption in a wavelength range of 750 to 1,400 nm. Particularly, since there is a case where on-press development is carried out using a printing press under white light in an on-press development type planographic printing plate precursor, a planographic printing plate precursor with excellent developability can be obtained by using an infrared absorbing agent having maximum absorption in a wavelength range of 750 to 1,400 nm which is unlikely to be affected by white light.

As the infrared absorbing agent, a dye or a pigment is preferably used. As the dye, commercially available dyes and known dyes described in the literatures such as "Dye Handbook" (edited by The Society of Synthetic Organic Chemistry, Japan, published in 1970) can be used.

Among such dyes, a cyanine dye, a squarylium dye, a pyrylium salt, a nickel thiolate complex, and an indolenine cyanine dye are particularly preferable.

Further, a cyanine dye or an indolenine cyanine dye is preferable and a cyanine dye represented by Formula a is particularly preferable.

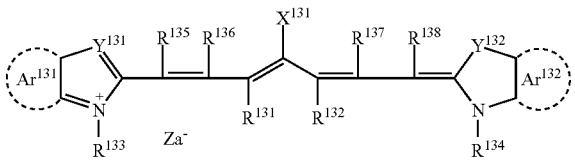

In Formula a, $X^{131}$ represents a hydrogen atom, a halogen atom, —$NPh_2$, —$X^{132}$-$L^{131}$, or a group represented by the following structural formula. Further, Ph represents a phenyl group.

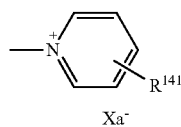

In Formula a, $X^{132}$ represents an oxygen atom, a nitrogen atom, or a sulfur atom, $L^{131}$ represents a hydrocarbon group having 1 to 12 carbon atoms, an aryl group having heteroatoms (N, S, O, a halogen atom, or Se), or a hydrocarbon group having heteroatoms and 1 to 12 carbon atoms. $Xa^-$ has the same definition as that for $Za^-$ described below. $R^{141}$ represents a hydrogen atom or a substituent selected from an alkyl group, an aryl group, a substituted or unsubstituted amino group, and a halogen atom. $R^{131}$ and $R^{132}$ each independently represent a hydrocarbon group having 1 to 12 carbon atoms. Further, $R^{131}$ and $R^{132}$ may be linked to each other to form a ring. $Ar^{131}$ and $Ar^{132}$ may be the same as or different from each other and represent an aryl group which may include a substituent. $Y^{131}$ and $Y^{132}$ may be the same as or different from each other and represent a dialkylmethylene group having 12 or less sulfur atoms or carbon atoms. $R^{133}$ and $R^{134}$ may be the same as or different from each other and represent a hydrocarbon group which may include a substituent and has 20 or less carbon atoms. $R^{135}$, $R^{136}$, $R^{137}$, and $R^{138}$ may be the same as or different from one another and represent a hydrogen atom or a hydrocarbon group having 12 or less carbon atoms. In addition, $Za^-$ represents a counter anion. Here, in a case where the cyanine dye represented by Formula a includes an anionic substituent in the structure thereof and neutralization of the charge is not necessary, $Za^-$ is not necessary.

Preferred examples of the substituent are the same as those described in JP2013-205569A.

The infrared absorbing dye may be used alone or in combination of two or more kinds thereof, and infrared absorbing agents other than the infrared absorbing dye such as a pigment may be used in combination. As the pigment, compounds described in paragraphs 0072 to 0076 of JP2008-195018A are preferable.

The content of the infrared absorbing agent is preferably in a range of 0.05% to 30% by mass, more preferably in a range of 0.1% to 20% by mass, and particularly preferably in a range of 0.2% to 10% by mass with respect to the total mass of the image recording layer.

[Polymerization Initiator]

It is preferable that the image recording layer used in the planographic printing plate precursor according to the present disclosure contains a polymerization initiator and a photopolymerization initiator.

In the present disclosure, the polymerization initiator is not particularly limited, but photoradical polymerization initiators described in JP2013-205569A are preferably used. Among these, an onium salt is preferable.

The polymerization initiator can be used alone or in combination of two or more kinds thereof.

Examples of the onium salt include an iodonium salt and a sulfonium salt. Hereinafter, specific examples of these compounds will be described, but the present disclosure is not limited to these.

As the iodonium salts, diphenyliodonium salts are preferable, electron-donating groups such as diphenyl iodonium salts substituted with an alkyl group or an alkoxyl group are particularly preferable, and asymmetric diphenyl iodonium salts are still more preferable. Specific examples thereof include diphenyliodonium=hexafluorophosphate, 4-methoxyphenyl-4-(2-methylpropyl) phenyliodonium=hexafluorophosphate, 4-(2-methylpropyl)phenyl-p-tolyliodonium=hexafluorophosphate, 4-hexyloxyphenyl-2,4,6-trimethoxyphenyliodonium=hexafluorophosphate, 4-hexyloxyphenyl-2,4-diethoxyphenyliodonium=tetrafluoroborate, 4-octyloxyphenyl-2,4,6-trimethoxyphenyliodonium=1-perfluorobutane-sulfonate, 4-octyloxyphenyl-2,4,6-trimethoxyphenyliodonium=hexafluorophosphate, and bis(4-t-butylphenyl)iodonium=tetraphenylborate.

Examples of the sulfonium salts include triphenylsulfonium=hexafluorophosphate, triphenylsulfonium=benzoylformate, bis(4-chlorophenyl)phenylsulfonium=benzoylformate, bis(4-chlorophenyl)-4-methylphenylsulfonium=tetrafluoroborate, tris(4-chlorophenyl)sulfonium=3,5-bis(methoxycarbonyl)benzenesulfonate, and tris(4-chlorophenyl)sulfonium=hexafluorophosphate.

Among these, an iodonium salt is preferable. It is particularly preferable that the onium salt is used in combination with an infrared absorbing agent having maximum absorption in a wavelength range of 750 to 1,400 nm.

The content of the polymerization initiator in the image recording layer is preferably in a range of 0.01% to 20% by mass, more preferably in a range of 0.1% to 15% by mass, and still more preferably in a range of 1.0% to 10% by mass with respect to the total mass of the image recording layer.

[Polymerizable Compound containing Hydrogen Bonding Group]

The image recording layer used in the present disclosure contains a polymerizable compound containing a hydrogen bonding group. According to the present disclosure, the planographic printing plate precursor including the image recording layer containing a polymerizable compound is a so-called negative type planographic printing plate precursor which includes an image recording layer having a polymerizing and curing function through any one or both of application of heat and exposure.

The polymerizable compound used in the image recording layer according to the present disclosure is a compound containing a polymerizable group and may be a radical polymerizable compound or a cationic polymerizable compound, but it is preferable that the polymerizable compound is an addition polymerizable compound (ethylenically unsaturated compound) having at least one ethylenically unsaturated bond. As the ethylenically unsaturated compound, a compound having at least one terminal ethylenically unsaturated bond is preferable and a compound having two or more terminal ethylenically unsaturated bonds is more preferable.

The polymerizable compounds have chemical forms such as a monomer, a pre-polymer, that is, a dimer, a trimer, an oligomer, a polymer, and a mixture of these. The polymerizable compound which is used in the image recording layer according to the present disclosure and contains a hydrogen bonding group contains at least one hydrogen bonding group. The hydrogen bonding group is not particularly limited, and examples thereof include an ether group, an ester group, an amino group, a hydroxy group, a sulfonamide group, an amide group, a urethane group, an imide group, and a urea group.

As the polymerizable compound containing a hydrogen bonding group, a polymerizable compound containing at least one group selected from the group consisting of a sulfonamide group, an amide group, a urethane group, an imide group, and a urea group is preferable.

Further, as the polymerizable compound containing a hydrogen bonding group, a polymerizable compound containing at least two groups selected from the group consisting of an ether group, an ester group, an amino group, a hydroxy group, a sulfonamide group, an amide group, a urethane group, an imide group, and a urea group is preferable, a polymerizable compound containing an ester group or an amide group and at least one group selected from an ether group, an amino group, a hydroxy group, a sulfonamide group, a urethane group, an imide group, and a urea group is more preferable, and a polymerizable compound containing an ester group and at least one group selected from the group consisting of a sulfonamide group, a urethane group, an imide group, and a urea group is still more preferable.

Examples of the monomer include esters of unsaturated carboxylic acid (such as acrylic acid, methacrylic acid, itaconic acid, crotonic acid, isocrotonic acid, or maleic acid) and amides thereof. Among these, esters of unsaturated carboxylic acid and a polyhydric alcohol compound and amides of unsaturated carboxylic acid and a polyhydric amine compound are preferably used. Further, addition reaction products with unsaturated carboxylic acid esters or amides having a nucleophilic substituent such as a hydroxy group, an amino group, or a mercapto group and monofunctional or polyfunctional isocyanates or epoxies; and dehydration condensation reaction products with monofunctional or polyfunctional carboxylic acid are suitably used. Moreover, addition reaction products with unsaturated carboxylic acid esters or amides having an electrophilic substituent such as an isocyanate group or an epoxy group and monofunctional or polyfunctional alcohols, amines, or thiols; and substitution reaction products with unsaturated carboxylic acid esters or amides having a leaving substituent such as a halogen atom or a tosyloxy group and monofunctional or polyfunctional alcohols, amines, or thiols are also suitably used. Further, as another example, compound groups formed by replacing the above-described unsaturated carboxylic acid with unsaturated phosphonic acid, styrene, vinyl ether, or the like can be used. These are described in references of JP2006-508380A, JP2002-287344A, JP2008-256850A, JP2001-342222A, JP1997-179296A (JP-H09-179296A), JP1997-179297A (JP-H09-179297A), JP1997-179298A (JP-H09-179298A), JP2004-294935A, JP2006-243493A, JP2002-275129A, JP2003-64130A, JP2003-280187A, and JP1998-333321A (JP-H10-333321A).

Specific examples of monomers of esters of a polyhydric alcohol compound and unsaturated carboxylic acid include acrylic acid ester such as ethylene glycol diacrylate, 1,3-butanediol diacrylate, tetramethylene glycol diacrylate, propylene glycol diacrylate, trimethylol propane triacrylate, hexanediol diacrylate, tetraethylene glycol diacrylate, pentaerythritol tetraacrylate, sorbitol triacrylate, isocyanuric acid ethylene oxide (EO)-modified triacrylate, and a polyester acrylate oligomer. Examples of the methacrylic acid ester include tetramethylene glycol dimethacrylate, neopentyl glycol dimethacrylate, trimethylol propane trimethacrylate, ethylene glycol dimethacrylate, pentaerythritol trimethacrylate, bis[p-(3-methacryloxy-2-hydroxypropoxy)phenyl] dimethyl methane, and bis-[p-(methacryloxyethoxy)phenyl] dimethylmethane. Specific examples of monomers of amides of a polyvalent amine compound and unsaturated carboxylic acid include methylene bis-acrylamide, methylene bis-methacrylamide, 1,6-hexamethylene bis-acrylamide, 1,6-hexamethylene bis-methacrylamide, diethylene triamine trisacrylamide, xylylene bisacrylamide, and xylylene bismethacrylamide.

Moreover, a urethane-based addition polymerizable compound produced using an addition reaction of an isocyanate group and a hydroxy group is preferable, and specific examples thereof include a vinyl urethane compound which is formed by adding a vinyl monomer containing a hydroxy group represented by Formula (M) to a polyisocyanate compound having two or more isocyanate groups in one molecule described in JP1973-41708B (JP-548-41708B) and contains two or more polymerizable vinyl groups in one molecule.

$$CH_2=C(R^{M4})COOCH_2CH(R^{M5})OH \quad (M)$$

In Formula (M), $R^{M4}$ and $R^{M5}$ each independently represent a hydrogen atom or a methyl group.

In addition, urethane acrylates described in JP1976-37193A (JP-S51-37193A), JP1990-32293B (JP-H02-32293B), JP1990-16765B (JP-H02-16765B), JP2003-344997A, and JP2006-65210A; urethane compounds having an ethylene oxide-based skeleton described in JP1983-49860B (JP-S58-49860B), JP1981-17654B (JP-S56-17654B), JP1987-39417B (JP-S62-39417B), JP1987-39418B (JP-S62-39418B), JP2000-250211A, and JP2007-94138A; and urethane compounds having a hydrophilic group described in US7153632B, JP1996-505958A (JP-H08-505958A), JP2007-293221A, and JP2007-293223A are also suitable.

The details of the structures of these polymerizable compounds, whether to be used alone or in combination, and the usage method for the addition amount or the like can be optionally set according to the applications of the final image recording layer or planographic printing plate precursor.

—Polymerizable Compound containing Ester Group—

A known (meth)acrylic acid ester compound can be used as the polymerizable compound containing an ester group.

As the ester group, a carboxylic acid ester group is preferable.

Examples of the polymerizable compound containing an ester group include the esters of unsaturated carboxylic acid.

The polymerizable compound containing an ester group may be a monofunctional (meth)acrylic acid ester compound or a polyfunctional (meth)acrylic acid ester compound, but a polyfunctional (meth)acrylic acid ester compound is preferable.

The number of (meth)acryloxy groups in the polyfunctional (meth)acrylic acid ester compound is preferably in a range of 2 to 10, more preferably in a range of 2 to 8, and still more preferably in a range of 2 to 6.

Specific examples of the polymerizable compound containing an ester group will be described below, but the present disclosure is not limited thereto. In the following specific examples, each numerical value on the lower right side of parentheses representing each constitutional unit of the polymer indicates the content (molar ratio) of the constitutional unit.

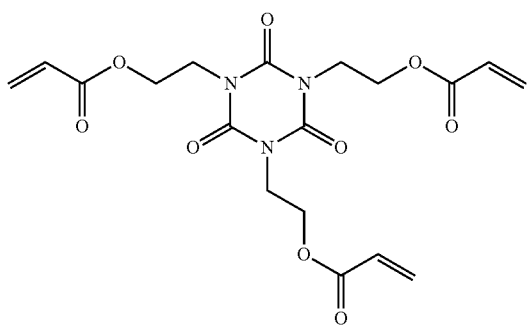

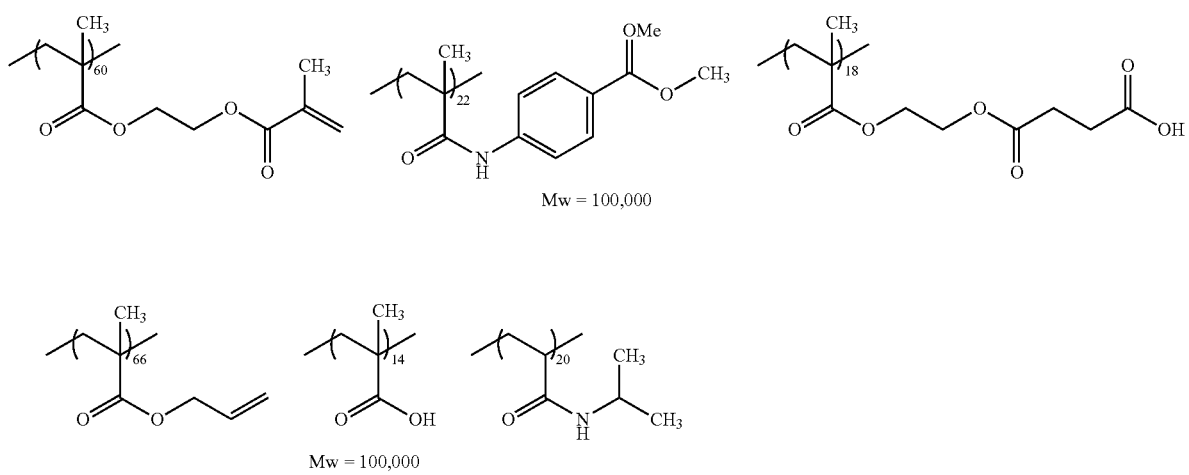

Mw = 100,000

Mw = 100,000

—Polymerizable Compound containing Amide Group—

A known (meth)acrylamide compound can be used as the polymerizable compound containing an amide group.

The (meth)acrylamide compound may be a monofunctional (meth)acrylamide compound or a polyfunctional (meth)acrylamide compound, but a polyfunctional (meth)acrylamide compound is preferable.

The number of (meth)acryloylamide groups in the polyfunctional (meth)acrylamide compound is preferably in a range of 2 to 10, more preferably in a range of 2 to 8, and still more preferably in a range of 2 to 6.

Examples of the polymerizable compound containing an amide group include the amides of unsaturated carboxylic acid.

Specific examples of the polymerizable compound containing an amide group will be described below, but the present disclosure is not limited thereto.

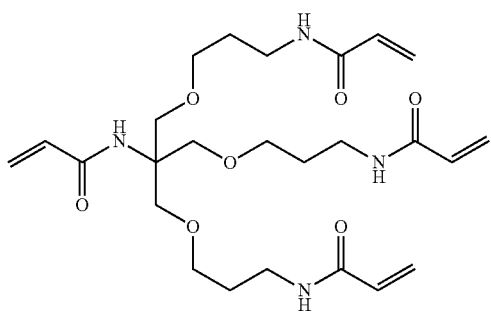 [SMILES: C=CC(=O)NCCCOCC(COCCCNC(=O)C=C)(COCCCNC(=O)C=C)NC(=O)C=C]

—Polymerizable Compound containing Ether Group—

A (meth)acrylic acid ester compound containing an ether group is preferable as the polymerizable compound containing an ether group.

A (meth)acrylic acid ester compound containing an alkyleneoxy group is preferable as the (meth)acrylic acid ester compound containing an ether group.

The number of carbon atoms of the alkyleneoxy group is preferably in a range of 2 to 8 and more preferably in a range of 2 to 4.

The (meth)acrylic acid ester compound containing an ether group may be a monofunctional (meth)acrylic acid ester compound or a polyfunctional (meth)acrylic acid ester compound, but a polyfunctional (meth)acrylic acid ester compound is preferable.

The number of (meth)acryloxy groups in the polyfunctional (meth)acrylic acid ester compound is preferably in a range of 2 to 10, more preferably in a range of 2 to 8, and still more preferably in a range of 2 to 6.

The number of ether groups in the polymerizable compound containing an ether group is preferably 2 or more. Further, it is preferable that the number of ether groups in the polymerizable compound containing an ether group is the same as or greater than the number of polymerizable groups in the polymerizable compound containing an ether group.

Specific examples of the polymerizable compound containing an ether group will be described below, but the present disclosure is not limited thereto.

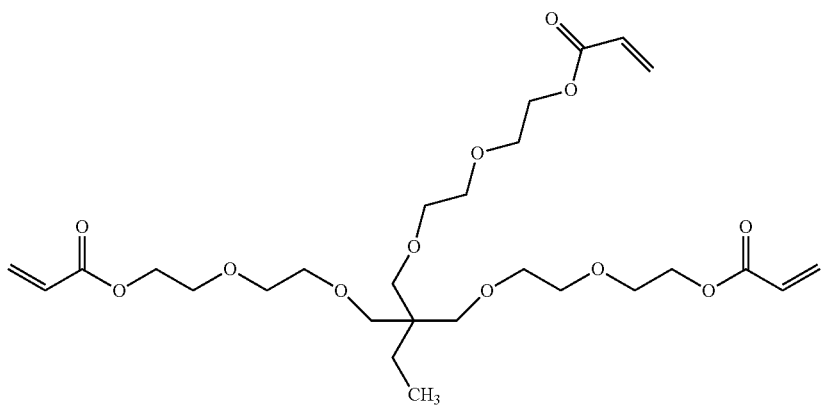 [SMILES: C=CC(=O)OCCOCCOCC(CC)(COCCOCCOC(=O)C=C)COCCOCCOC(=O)C=C]

—Polymerizable Compound containing Amino Group—

A (meth)acrylic acid ester compound containing an amino group is preferable as the polymerizable compound containing an amino group.

A (meth)acrylic acid ester compound containing an amino group may be a primary amino group, a secondary amino group, or a tertiary amino group, but a secondary or tertiary amino group is preferable and a tertiary amino group is more preferable.

The (meth)acrylic acid ester compound containing an amino group may be a monofunctional (meth)acrylic acid ester compound or a polyfunctional (meth)acrylic acid ester compound, but a monofunctional (meth)acrylic acid ester compound is preferable.

The number of amino groups in the polymerizable compound containing an amino group is preferably 2 or more. Further, it is preferable that the number of amino groups in the polymerizable compound containing an amino group is the same as or greater than the number of polymerizable groups in the polymerizable compound containing an amino group.

Specific examples of the polymerizable compound containing an amino group will be described below, but the present disclosure is not limited thereto.

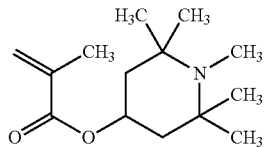

—Polymerizable Compound containing Hydroxy Group—

A (meth)acrylic acid ester compound containing a hydroxy group is preferable as the polymerizable compound containing a hydroxy group.

A (meth)acrylic acid ester compound containing a hydroxy group may be a monofunctional (meth)acrylic acid ester compound or a polyfunctional (meth)acrylic acid ester compound, but a polyfunctional (meth)acrylic acid ester compound is preferable.

The number of (meth)acryloxy groups in the polyfunctional (meth)acrylic acid ester compound is preferably in a range of 2 to 10, more preferably in a range of 2 to 8, and still more preferably in a range of 2 to 6.

The number of amino groups in the polymerizable compound containing a hydroxy group is preferably 2 or more. Further, it is preferable that the number of hydroxy groups in the polymerizable compound containing a hydroxy group is the same as or greater than the number of polymerizable groups in the polymerizable compound containing a hydroxy group.

Specific examples of the polymerizable compound containing a hydroxy group will be described below, but the present disclosure is not limited thereto.

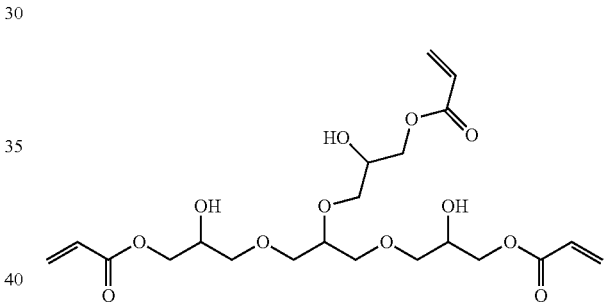

—Polymerizable Compound containing Sulfonamide Group—

A (meth)acrylic acid ester compound containing a sulfonamide group is preferable as the polymerizable compound containing a sulfonamide group.

The sulfonamide group may be a monovalent group represented by —$SO_2NH_2$ or a divalent group represented by —$SO_2NH$—, but a divalent group represented by —$SO_2NH$— is preferable.

The (meth)acrylic acid ester compound containing a sulfonamide group may be a monofunctional (meth)acrylic acid ester compound or a polyfunctional (meth)acrylic acid ester compound, but a polyfunctional (meth)acrylic acid ester compound is preferable.

The number of (meth)acryloxy groups in the polyfunctional (meth)acrylic acid ester compound is preferably in a range of 2 to 10, more preferably in a range of 2 to 8, and still more preferably in a range of 2 to 6.

The number of sulfonamide groups in the polymerizable compound containing a sulfonamide group is preferably 2 or more. Further, it is preferable that the number of sulfonamide groups in the polymerizable compound containing a sulfonamide group is the same as or greater than the number of polymerizable groups in the polymerizable compound containing a sulfonamide group.

Specific examples of the polymerizable compound containing a sulfonamide group will be described below, but the present disclosure is not limited thereto.

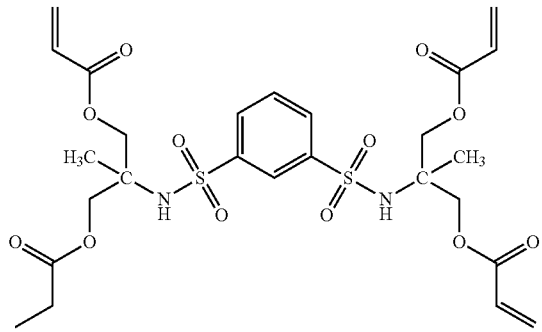 [SMILES: C=CC(=O)OCC(C)(COC(=O)C=C)NS(=O)(=O)c1cccc(S(=O)(=O)NC(C)(COC(=O)C=C)COC(=O)CC)c1]

—Polymerizable Compound containing Urethane Group—

A (meth)acrylic acid ester compound containing a urethane group is preferable as the polymerizable compound containing a urethane group.

The (meth)acrylic acid ester compound containing a urethane group may be a monofunctional (meth)acrylic acid ester compound or a polyfunctional (meth)acrylic acid ester compound, but a polyfunctional (meth)acrylic acid ester compound is preferable.

The number of (meth)acryloxy groups in the polyfunctional (meth)acrylic acid ester compound is preferably in a range of 2 to 10, more preferably in a range of 2 to 8, and still more preferably in a range of 2 to 6.

The number of urethane groups in the polymerizable compound containing a urethane group is preferably 2 or more. Further, it is preferable that the number of urethane groups in the polymerizable compound containing a urethane group is the same as or greater than the number of polymerizable groups in the polymerizable compound containing a urethane group.

The above-described urethane-based addition polymerizable compound can be preferably used as the polymerizable compound containing a urethane group.

Specific examples of the polymerizable compound containing a urethane group will be described below, but the present disclosure is not limited thereto. In the following specific examples, each numerical value on the lower right side of parentheses representing each constitutional unit of the polymer indicates the content (molar ratio) of the constitutional unit.

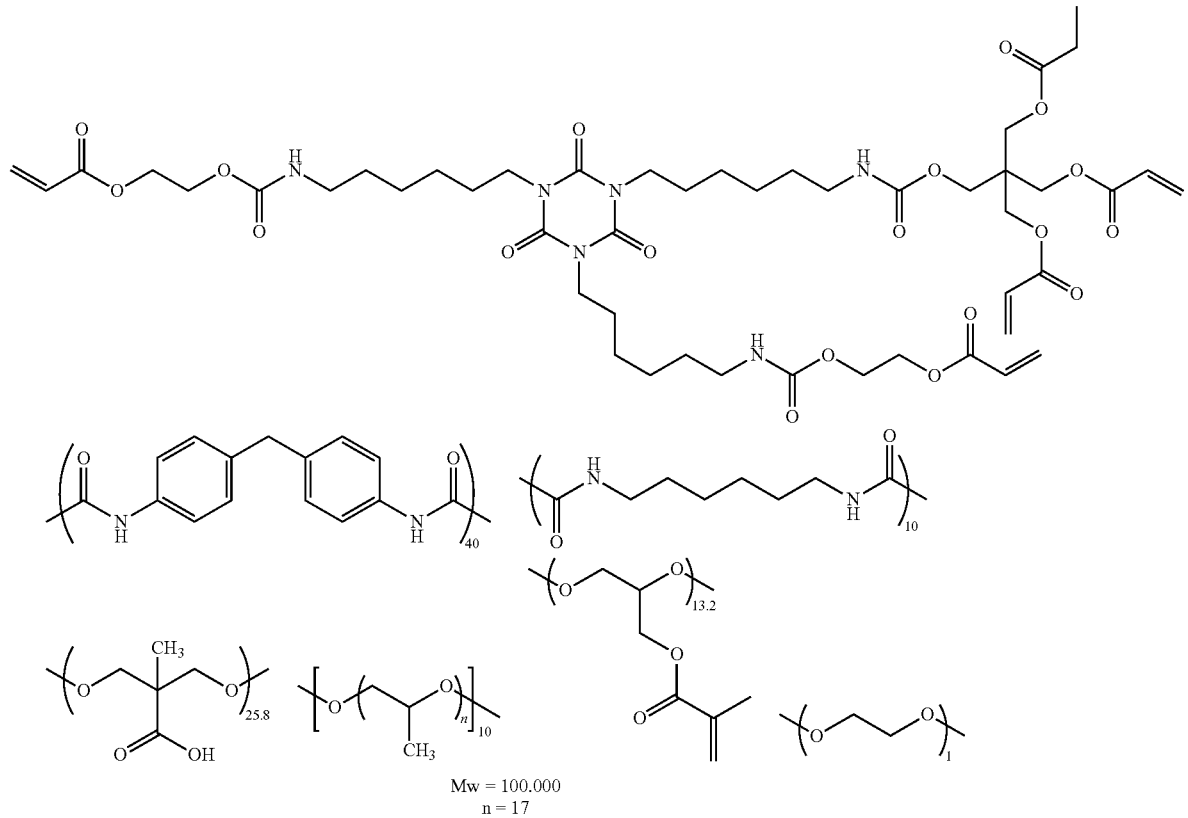

—Polymerizable Compound containing Imide Group—

A maleimide compound is preferable as the polymerizable compound containing an imide group.

The maleimide compound may be a monofunctional maleimide compound or a polyfunctional maleimide compound, but polyfunctional maleimide is preferable.

The number of maleimide groups in the polyfunctional maleimide compound is preferably in a range of 2 to 10, more preferably in a range of 2 to 8, and still more preferably in a range of 2 to 6.

The maleimide compound may further have a structure containing an imide group such as a phthalimide structure.

The number of imide groups in the polymerizable compound containing an imide group is preferably 2 or more. Further, it is preferable that the number of imide groups in the polymerizable compound containing an imide group is the same as or greater than the number of polymerizable groups in the polymerizable compound containing an imide group.

The content of the polymerizable compound containing a hydrogen bonding group is preferably in a range of 5% to 75% by mass, more preferably in a range of 10% to 70% by mass, and particularly preferably in a range of 15% to 60% by mass with respect to the total solid content of the image recording layer.

Further, the solid content indicates an amount of components obtained by removing volatile components such as a solvent.

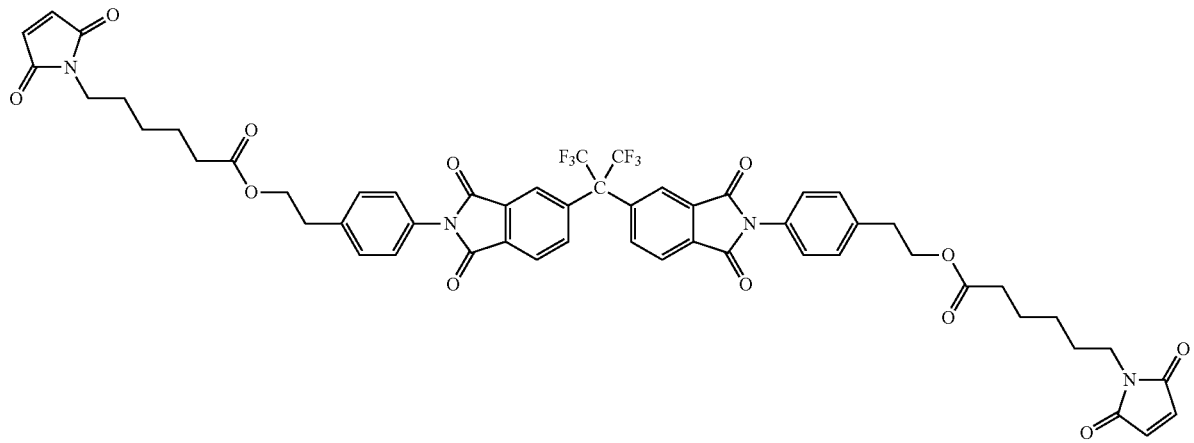 [SMILES: O=C(CCCCCN1C(=O)C=CC1=O)OCCc1ccc(N2C(=O)c3ccc(C(c4ccc5c(c4)C(=O)N(c4ccc(CCOC(=O)CCCCCN6C(=O)C=CC6=O)cc4)C5=O)(C(F)(F)F)C(F)(F)F)cc3C2=O)cc1]

—Polymerizable Compound containing Urea Group—

A (meth)acrylic acid ester compound containing a urea group is preferable as the polymerizable compound containing a urea group.

The (meth)acrylic acid ester compound containing a urea group may be a monofunctional (meth)acrylic acid ester compound or a polyfunctional (meth)acrylic acid ester compound, but a polyfunctional (meth)acrylic acid ester compound is preferable.

The number of (meth)acryloxy groups in the polyfunctional (meth)acrylic acid ester compound is preferably in a range of 2 to 10, more preferably in a range of 2 to 8, and still more preferably in a range of 2 to 6.

The number of urea groups in the polymerizable compound containing a urea group is preferably 2 or more. Further, it is preferable that the number of urea groups in the polymerizable compound containing a urea group is the same as or greater than the number of polymerizable groups in the polymerizable compound containing a urea group.

Specific examples of the polymerizable compound containing a urea group will be described below, but the present disclosure is not limited thereto.

[Hard polymer particles containing at least one group selected from group consisting of urethane group, urea group, imide group, amide group, and sulfonamide group on surface thereof]

The image recording layer used in the present embodiment contains hard polymer particles (hereinafter, also referred to as "specific hard polymer particles") containing at least one group selected from the group consisting of a urethane group, a urea group, an imide group, an amide group, and a sulfonamide group on the surface thereof.

—Hard Polymer Particles—

The specific hard polymer particles indicate particles formed of a polymer with a high interaction of a polymer main structure or particles formed of a polymer with a high crosslink density. Specifically, polymer particles with a Rockwell hardness of R30 or greater are preferable, polymer particles with R100 or greater or M50 or greater are more preferable, and polymer particles with M65 or greater are still more preferable.

The Rockwell hardness of polymer particles can be obtained by press-forming polymer particles at an optional compression forming temperature to prepare a polymer

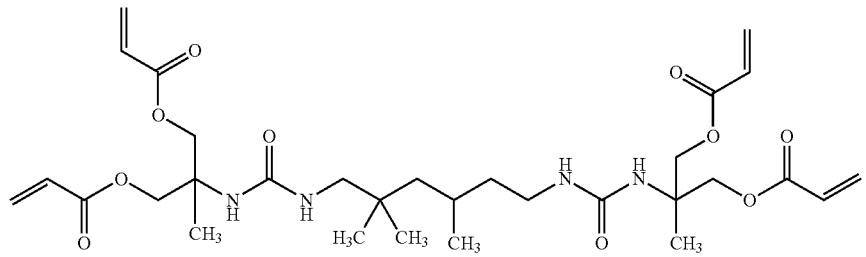 [SMILES: C=CC(=O)OCC(C)(COC(=O)C=C)NC(=O)NCCC(C)CC(C)(C)CNC(=O)NC(C)(COC(=O)C=C)COC(=O)C=C]

piece and measuring the Rockwell hardness of the polymer piece according to a method in conformity with ASTM D785.

—Polymer Constituting Specific Hard Polymer Particles—

The polymer constituting the specific hard polymer particles is not particularly limited, and examples thereof include polystyrene, poly(meth)acrylonitrile, a styrene-(meth)acrylonitrile copolymer, a styrene-butadiene-(meth)acrylonitrile copolymer, polyvinylidene chloride, polypropylene, polymethyl methacrylate, a methacrylstyrene copolymer, cellulose acetate, polycarbonate, and polyamide. Among these, a styrene-(meth)acrylonitrile copolymer, polymethyl methacrylate, or a methacrylstyrene copolymer is preferable, and a styrene-(meth)acrylonitrile copolymer is more preferable.

(1) Styrene-(meth)acrylonitrile Copolymer

It is preferable that the polymer constituting the specific hard polymer particles used in the present disclosure includes a polymer having any one or both of a monomer unit derived from a styrene compound and a monomer unit derived from a (meth)acrylonitrile compound, and more preferable that the polymer includes a polymer having a monomer unit derived from a styrene compound and a monomer unit derived from a (meth)acrylonitrile compound.

The polymer having a monomer unit derived from a styrene compound and a monomer unit derived from a (meth)acrylonitrile compound is also referred to as a styrene-(meth)acrylonitrile copolymer.

Further, it is preferable that the polymer constituting the specific hard polymer particles used in the present disclosure is a polymer further having a monomer unit derived from a poly(ethylene glycol)alkyl ether (meth)acrylate compound and more preferable that the polymer is a polymer further having a monomer unit derived from a poly(ethylene glycol) alkyl ether methacrylate compound.

Particularly, in a case where the polymer constituting the specific hard polymer particles includes a polymer having any one or both of a monomer unit derived from a styrene compound and a monomer unit derived from a (meth)acrylonitrile compound, it is more preferable that the polymer further has a monomer unit derived from a poly(ethylene glycol)alkyl ether (meth)acrylate compound and still more preferable that the polymer further has a monomer unit derived from a poly(ethylene glycol)alkyl ether methacrylate compound.

[Styrene Compound]

Examples of the styrene compound include styrene, 4-methylstyrene, 4-hydroxystyrene, 4-acetoxystyrene, 4-acetylstyrene, and styrene sulfonic acid. Among these, styrene is preferable.

[(Meth)acrylonitrile Compound]

Examples of the (meth)acrylonitrile compound include (meth)acrylonitrile. Among examples, acrylonitrile is preferable.

[Total Content of Monomer Unit Derived from Styrene Compound and Monomer Unit Derived from (meth)acrylonitrile Compound]

In the polymer used in the present disclosure which has any one or both of the monomer unit derived from a styrene compound and the monomer unit derived from a (meth)acrylonitrile compound, the total content of the monomer unit derived from a styrene compound and the monomer unit derived from a (meth)acrylonitrile compound is preferably in a range of 10% to 80% by mass, more preferably in a range of 15% to 50% by mass, and still more preferably in a range of 20% to 40% by mass with respect to the total mass of the polymer.

Further, according to the present disclosure, in a case where a styrene-(meth)acrylonitrile copolymer is used, the content of the monomer unit derived from a styrene compound contained in the styrene-(meth)acrylonitrile copolymer is preferably in a range of 5% to 50% by mass, more preferably in a range of 8% to 40% by mass, and still more preferably in a range of 10% to 30% by mass with respect to the total mass of the styrene-(meth)acrylonitrile copolymer. According to the aspect, the content of the monomer unit derived from a (meth)acrylonitrile compound is preferably in a arrange of 5% to 50% by mass, more preferably in a range of 8% to 40% by mass, and still more preferably in a range of 10% to 30% by mass with respect to the total mass of the styrene-(meth)acrylonitrile copolymer.

[Poly(ethylene glycol)alkyl Ether (meth)acrylate Compound]

The number of carbon atoms of the alkyl group in the poly(ethylene glycol)alkyl ether (meth)acrylate compound used in the present disclosure is preferably in a range of 1 to 10, more preferably in a range of 1 to 8, and still more preferably in a range of 1 to 4.

Further, the weight-average molecular weight of the poly (ethylene glycol)alkyl ether (meth)acrylate compound used in the present disclosure is preferably in a range of 300 to 10,000, more preferably in a range of 500 to 8,000, and still more preferably in a range of 1,000 to 5,000.

In the present disclosure, the weight-average molecular weight of polymer components indicates the weight-average molecular weight (Mw) in terms of polystyrene to be measured using gel permeation chromatography (GPC) in a case where tetrahydrofuran (THF) is used as a solvent, unless otherwise noted.

Examples of the poly(ethylene glycol)alkyl ether (meth) acrylate compound include methoxy polyethylene glycol (meth)acrylate, ethoxy polyethylene glycol (meth)acrylate, and isopropoxy polyethylene glycol (meth)acrylate. Among these, methoxy polyethylene glycol (meth)acrylate is preferable.

[Total Content of Monomer Unit Derived from Poly (ethylene glycol)alkyl Ether (meth)acrylate Compound]

The total content of the monomer unit derived from the poly(ethylene glycol)alkyl ether methacrylate compound in the polymer constituting the specific hard polymer particles used in the present disclosure is preferably in a range of 5% to 40% by mass and more preferably in a range of 7% to 30% by mass with respect to the total mass of the polymer constituting the specific hard polymer particles.

(2) Poly(meth)acrylic Acid Alkyl Ester

It is preferable that the polymer constituting the specific hard polymer particles used in the present disclosure contains poly(meth)acrylic acid alkyl ester having a constitutional unit derived from a (meth)acrylic acid alkyl ester compound.

[(Meth)acrylic Acid Alkyl Ester Compound]

From the viewpoint of the hardness of the hard polymer particles, it is preferable that the (meth)acrylic acid alkyl ester compound is a methacrylic acid alkyl ester compound.

Further, the number of carbon atoms of the alkyl group in the (meth)acrylic acid alkyl ester compound is preferably in a range of 1 to 10, more preferably in a range of 1 to 4, still more preferably 1 or 2, and particularly preferably 1.

As the (meth)acrylic acid alkyl ester compound, methyl methacrylate or ethyl methacrylate is preferable, and methyl methacrylate is more preferable.

[Total Content of Monomer Unit Derived from (meth) acrylic Acid Alkyl Ester Compound]

The total content of the monomer unit derived from the (meth)acrylic acid alkyl ester compound in the poly(meth) acrylic acid alkyl ester used in the present disclosure is preferably in a range of 50% to 100% by mass, more preferably in a range of 70% to 100% by mass, and still more preferably in a range of 80% to 100% by mass with respect to the total mass of the poly(meth)acrylic acid alkyl ester.

[Molecular Weight of Polymer Constituting Specific Hard Polymer Particles]

The weight-average molecular weight of the polymer constituting the specific hard polymer particles used in the present disclosure is preferably in a range of 3,000 to 100,000, more preferably in a range of 5,000 to 80,000, and still more preferably in a range of 10,000 to 60,000.

—Method of Producing Specific Hard Polymer Particles—

The specific hard polymer particles used in the present disclosure contain at least one group selected from the group consisting of a urethane group, a urea group, an imide group, an amide group, and a sulfonamide group on the surface thereof.

At least one group selected from the group consisting of a urethane group, a urea group, an imide group, an amide group, and a sulfonamide group can be grafted to the surface by polymerizing a monomer containing these groups in the presence of the polymer constituting the specific hard polymer particles.

The polymerization method is not particularly limited, and a known surface graft polymerization method can be used. For example, the polymer constituting the specific hard polymer particles and an ethylenically unsaturated compound containing at least one group selected from the group consisting of a urethane group, a urea group, an imide group, an amide group, and a sulfonamide group are heated in a reaction solvent in the presence of an appropriate polymerization initiator so that the polymer and the ethylenically unsaturated compound can be bonded to each other.

From the viewpoint of the hardness of particles, it is preferable that the specific hard polymer particles used in the present disclosure are core shell type particles in which the composition of the surface of the particle is different from the composition inside the particle. It is preferable that the core of the core shell type particle contains the polymer constituting the specific hard polymer particles, more preferable that the core contains the polymer having a monomer unit derived from a styrene compound and/or a monomer unit derived from a (meth)acrylonitrile compound or poly (meth)acrylic acid alkyl ester, and still more preferable that the core contains the styrene-(meth)acrylonitrile copolymer or methyl polymethacrylate.

As a shell layer, a polymer having a monomer unit derived from a monomer containing at least one group selected from the group consisting of a urethane group, a urea group, an imide group, an amide group, and a sulfonamide group is preferable.

Hereinafter, the monomer containing at least one group selected from the group consisting of a urethane group, a urea group, an imide group, an amide group, and a sulfonamide group will be described.

[Monomer containing Urethane Group]

As the monomer containing a urethane group, a urethane (meth)acrylate compound is preferable.

The number of (meth)acryloxy groups in the urethane (meth)acrylate compound is preferably in a range of 1 to 4 and more preferably 1 or 2.

The (meth)acryloxy group in the urethane (meth)acrylate compound may be any one or both of an acryloxy group and a methacryloxy group, but an acryloxy group is preferable.

The number of urethane groups in the urethane (meth) acrylate compound is not particularly limited, but is preferably in a range of 1 to 5, more preferably in a range of 1 to 4, and still more preferably in a range of 2 to 4.

It is preferable that the urethane (meth)acrylate compound contains an aromatic group and is more preferable that the urethane (meth)acrylate compound contains a phenyl group.

Examples of the urethane (meth)acrylate compound which can be used in the present disclosure include a urethane addition polymerizable compound produced using an addition reaction between isocyanate and a hydroxyl group, and urethane acrylates described in JP1976-37193A (JP-S51-37193A), JP1990-32293B (JP-H02-32293B), and JP1990-16765B (JP-H02-16765B), and these descriptions are incorporated in the specification of the present application.

Examples of commercially available products of the urethane (meth)acrylate compound include NK ESTER, U-6HA, UA-1100H, U-6LPA, U-15HA, U-6H, U-10HA, U-10PA, UA-53H, and UA-33H (all registered trademarks) available from Shin-Nakamura chemical Co., Ltd., AH-600, AT-600, UA-306H, UA-306T, UA-3061, and UA-510H available from KYOEISHA CHEMICAL Co., Ltd., Laromer UA-9048, UA-9050, and PR9052 available from BASF SE, and EBECRYL 220, 5129, 8301, KRM8200, 8200AE, and 8452 available from DAICEL-ALLNEX LTD.

Specific examples of the monomer containing a urethane group are shown below, but the present disclosure is not limited to these.

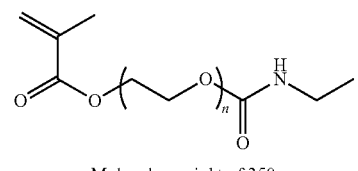

Molecular weight of 350

[Monomer containing Urea Group]

As the monomer containing a urea group used in the present disclosure, a (meth)acrylate compound containing a urea group is preferable.

The number of (meth)acryloxy groups in the (meth) acrylate compound containing a urea group is preferably in a range of 1 to 4, more preferably 1 or 2, and still more preferably 1.

The (meth)acryloxy group in the (meth)acrylate compound containing a urea group may be any one or both of an acryloxy group and a methacryloxy group, but a methacryloxy group is preferable.

The number of urea groups in the (meth)acrylate compound containing a urea group is not particularly limited, but is preferably in a range of 1 to 5, more preferably in a range of 1 to 4, and still more preferably 1 or 2.

It is preferable that the (meth)acrylate compound containing a urea group contains an aromatic group and more preferable that the (meth)acrylate compound contains a phenyl group.

Specific examples of the monomer containing a urea group will be described below, but the present disclosure is not limited to these.

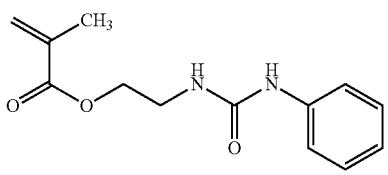 [SMILES: C=C(C)C(=O)OCCNC(=O)Nc1ccccc1]

[Monomer containing Imide Group]

As the monomer containing an imide group used in the present disclosure, a maleimide compound is preferable.

The number of maleimide groups in the maleimide compound is preferably in a range of 1 to 4, more preferably 1 or 2, and still more preferably 1.

It is preferable that the maleimide compound contains an aromatic group and more preferable that the maleimide compound contains a phenyl group.

Specific examples of the monomer containing an imide group will be described below, but the present disclosure is not limited to these.

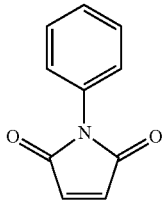

[Monomer containing Amide Group]

As the monomer containing an amide group used in the present disclosure, a (meth)acrylamide compound is preferable.

The number of (meth)acryloylamide groups in the (meth)acrylamide compound is preferably in a range of 1 to 4, more preferably 1 or 2, and still more preferably 1.

The (meth)acryloylamide group in the (meth)acrylamide compound may be any one or both of an acryloylamide group and a methacryloylamide group, but an acryloylamide group is preferable.

As the (meth)acrylamide compound, aliphatic (meth)acrylamide is preferable.

Examples of the (meth)acrylamide compound include (meth)acrylamide, N-methyl (meth)acrylamide, N-ethyl (meth)acrylamide, N-propyl (meth)acrylamide, N-n-butyl (meth)acrylamide, N-t-butyl (meth)acrylamide, N-butoxymethyl (meth)acrylamide, N-isopropyl (meth)acrylamide, N-methylol (meth)acrylamide, N,N-dimethyl (meth)acrylamide, N,N-diethyl (meth)acrylamide, N-phenyl (meth)acrylamide, and (meth)acryloyl morpholine.

[Monomer containing Sulfonamide Group]

As the monomer containing a sulfonamide group used in the present disclosure, a (meth)acrylamide compound containing a sulfonamide group is preferable.

The number of (meth)acryloylamide groups in the (meth)acrylamide compound containing a sulfonamide group is preferably in a range of 1 to 4, more preferably 1 or 2, and still more preferably 1.

The (meth)acryloylamide group in the (meth)acrylamide compound containing a sulfonamide group may be any one or both of an acryloylamide group and a methacryloylamide group, but a methacryloylamide group is preferable.

The number of sulfonamide groups in the (meth)acrylamide compound containing a sulfonamide group is not particularly limited, but is preferably in a range of 1 to 5, more preferably in a range of 1 to 4, and still more preferably 1 or 2.

It is preferable that the (meth)acrylamide compound containing a sulfonamide group contains an aromatic group and more preferable that the (meth)acrylamide compound contains a phenylene group.

The sulfonamide group may be a divalent group represented by —SO$_2$NH— or a monovalent group represented by —SO$_2$NH$_2$, but a monovalent group represented by —SO$_2$NH$_2$ is preferable.

Specific examples of the monomer containing a sulfonamide group will be described below, but the present disclosure is not limited to these.

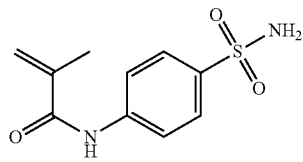 [SMILES: C=C(C)C(=O)Nc1ccc(S(N)(=O)=O)cc1]

[Total Content of Monomer Unit Derived from Monomer containing Urethane Group, Urea Group, Imide Group, Amide Group, or Sulfonamide Group]

The total content of the monomer unit derived from the monomer containing a urethane group, a urea group, an imide group, an amide group, or a sulfonamide group in the specific hard polymer particles used in the present disclosure is preferably in a range of 5% to 40% by mass and more preferably in a range of 7% to 30% by mass with respect to the total mass of the polymer components contained in the specific hard polymer particles.

—Coating Ratio in Specific Hard Polymer Particles—

The urethane group, the urea group, the imide group, the amide group, or the sulfonamide group may form a covalent bond or a coordinate bond with the surface of the polymer constituting the specific hard polymer particles or may be bonded to the surface of the polymer constituting the specific hard polymer particles through an ionic interaction or a hydrogen bond.

The coating ratio of the urethane group, the urea group, the imide group, the amide group, and the sulfonamide group present on the surface of the hard polymer is preferably in a range of 1% to 99%, more preferably in a range of 5% to 90%, and still more preferably in a range of 10% to 80%.

[Method of Measuring Coating Ratio]

The amount of the urethane group, the urea group, the imide group, the amide group, and the sulfonamide group present on the surface of the specific hard polymer is measured by analyzing the isolated specific hard polymer particles using a TOF-SIMS method. Hereinafter, the TOF-SIMS method which is an analytical method will be described.

The TOF-SIMS method is an abbreviation for time-of-flight secondary ion mass spectrometry and is a method of measuring ions reflecting the structure of an organic compound present on a surface of a solid sample by measuring secondary ions such as molecular ions or fragment ions released from molecules in the sample through irradiation with primary ions such as Ga$^+$ or In$^+$. Since the detection depth according to the TOF-SIMS method is approximately several nanometers, this method is effective for analyzing the chemical structure of the particle surface and is used in the present disclosure. Secondary ions can be detected using the TOF-SIMS method in both cases of positive ions and negative ions. Ions in which the mass of isolated particles is in a range of 0 to 1,000 [m/z] are measured. The measurement using the TOF-SIMS method is performed under the following conditions.

Device: TRIFT II, manufactured by Physical Electronics, Inc. (PHI), primary ion; $Ga^+$ (15 kV)
Aperture: No. 3 ($Ga^+$ current amount: equivalent to 600 pA)
Mapping area: 100 to 240 µm
Number of mapping points: 256×256 points
Mass of secondary ions to be detected: 0 to 1000 amu (amu: atom mass unit)

Data processing is performed on positive ions and negative ions with a mass of 0 to 1,000 [m/z] obtained according to the TOF-SIMS method using Win Cadence Software Version 3.41 (hereinafter, referred to as Cadence Software), manufactured by Physical Electronics, Inc. (PHI) so that fragment ions reflecting the chemical structure of the urethane group, the urea group, the imide group, the amide group, or the sulfonamide group, for example, $CNO^-$ and $SO_2^-$ are detected. At the time of acquisition of fragment ions according to the TOF-SIMS method, in order to reliably distinguish (avoid false recognition or confusion) the fragment ions from ions species derived from other materials, spectrum measurement with millimass accuracy is performed in a mass resolution priority mode (mass resolution of 27Al is 4,000 or greater), ion species from which sufficient measurement intensity (secondary ion intensity at the time mapping measurement is desirably 10,000 counts or greater) is obtained are selected from ion species with a high mass which reflect the chemical structure as much as possible.

In calculation of the coating ratio, homopolymers obtained by polymerizing or condensing monomers containing urethane, urea, imide, amide, and sulfonamide which are objects to be measured in advance are respectively prepared, and the number of points for which $CNO^-$ and the like are verified in the number of mapping points measured according to the TOF-SIMS method is defined as a coating ratio of 100%. The coating ratio is obtained by calculating the ratio of the number of points for which $CNO^-$ and the like are verified to the number of mapping points measured according to the TOF-SIMS method after the specific hard polymer particles are isolated.

—Characteristics of Specific Hard Polymer Particles—

The number average primary particle diameter of the specific hard polymer particles is in a range of 0.01 to 1.0 µm, preferably in a range of 0.05 to 0.7 µm, and more preferably in a range of 0.1 to 0.5 µm. In a case where the number average primary particle diameter thereof is in the above-described range, the storage stability of the planographic printing plate precursor is excellent and the resolution of the planographic printing plate to be obtained is excellent. The expression "the storage stability of the planographic printing plate precursor is excellent" means that stabilized developability is obtained even after storage for a long period of time.

The number average primary particle diameter can be measured by acquiring a captured image binarized using a scanning electron microscope (SEM) after the specific hard polymer particles are isolated, measuring the circumferential length with respect to 500 particles, and arithmetically averaging the equivalent circle diameters calculated from the circumferential lengths.

The content of the specific hard polymer particles is preferably in a range of 5% to 90% by mass with respect to the total solid content of the image recording layer.

[Binder Polymer]

It is preferable that the image recording layer in the planographic printing plate precursor according to the present disclosure further contains a binder polymer.

The binder polymer is a polymer component that does not contain a polymerizable group.

The binder polymer is not particularly limited, and known binder polymers can be used. For example, binder polymers described in JP2013-205569A can be used.

As the binder polymer, a binder polymer which can carry constituent components of the image recording layer on a support and can be removed by a developer is used.

As the binder polymer, a (meth)acrylic polymer, a polyurethane resin, a polyvinyl alcohol resin, a polyvinyl butyral resin, a polyvinyl formal resin, a polyamide resin, a polyester resin, or an epoxy resin is preferably used. Further, a (meth)acrylic polymer, a polyurethane resin, or a polyvinyl butyral resin is more preferably used, and a (meth)acrylic polymer, a polyurethane resin, or a polyvinyl butyral resin is still more preferably used.

As the binder polymer used in the present disclosure, suitable examples of the (meth)acrylic polymer include a copolymer having a constitutional unit containing an acid group. Examples of the acid group include a carboxylic acid group, a sulfonic acid group, a phosphonic acid group, a phosphoric acid group, and a sulfonamide group. Among these, a carboxylic acid group is particularly preferable. As the constitutional unit containing the acid group, a constitutional unit derived from (meth)acrylic acid or a structure represented by Formula I described in JP2013-205569A is preferably used.

Formula I

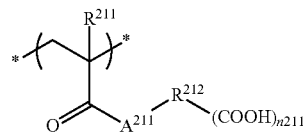

In Formula I, $R^{211}$ represents a hydrogen atom or a methyl group, and $R^{212}$ represents a single bond or a (n211+1)-valent linking group. $A^{211}$ represents an oxygen atom or $-NR^{213}-$, and $R^{213}$ represents a hydrogen atom or a monovalent hydrocarbon group having 1 to 10 carbon atoms. n211 represents an integer of 1 to 5.

From the viewpoint of developability, the ratio (% by mole) of the monomer unit containing a carboxylic acid group to all monomer units contained in the binder polymer used in the present disclosure is preferably in a range of 1% to 70%. From the viewpoint of obtaining both of developability and printing durability, the ratio thereof is more preferably in a range of 1% to 50% and particularly preferably in a range of 1% to 30%.

The binder polymer used in the present disclosure may have a constitutional unit derived from a monomer such as alkyl (meth)acrylate or aralkyl ester, (meth)acrylamide or a derivative thereof, α-hydroxymethyl acrylate, or a styrene derivative, in addition to the constitutional unit containing the acid group. Suitable examples of the monomer include those described in JP2013-205569A.

Further, in a case where the planographic printing plate precursor according to the present disclosure is a planographic printing plate precursor used for on-press development, it is preferable that the binder polymer contains a hydrophilic group. The hydrophilic group contributes to imparting on-press developability to the image recording layer.

Examples of the hydrophilic group which may be contained in the binder polymer include a hydroxy group, a carboxy group, an alkylene oxide structure, an amino group, an ammonium group, an amide group, a sulfo group, and a phosphoric acid group. Among these, an alkylene oxide structure which has 1 to 9 alkylene oxide units having 2 or 3 carbon atoms is preferable. For example, the hydrophilic group is imparted to the binder by copolymerizing a monomer containing the hydrophilic group.

The weight-average molecular weight of the binder polymer is preferably in a range of 10,000 to 300,000. Further, the number average molecular weight thereof is preferably in a range of 2,000 to 250,000. The polydispersity (weight-average molecular weight/number average molecular weight) is preferably in a range of 1.1 to 10.

The binder polymer may be used alone or in a mixture of two or more kinds thereof.

From the viewpoints of excellent strength of an image area and excellent image formability, the content of the binder polymer is preferably in a range of 5% to 75% by mass, more preferably in a range of 10% to 70% by mass, and still more preferably in a range of 10% to 60% by mass with respect to the total mass of the image recording layer.

[Borate Salt]

It is preferable that the image recording layer in the planographic printing plate precursor according to the present disclosure contains a borate salt.

Further, as the borate salt, a compound other than a polymerization initiator is preferable.

As the borate salt, a triaryl alkyl borate salt or a tetraaryl borate salt is preferable, a triphenyl alkyl borate salt or a tetraphenyl borate salt is more preferable, and a tetraphenyl borate salt is particularly preferable.

The tetraaryl borate salt is a salt of a boron central anion having four bonds with respect to an aryl group. The tetraaryl borate salt is typically represented by $[A^+][B(Ar^1)(Ar^2)(Ar^3)(Ar^4)^-]$, $Ar^1$ to $Ar^4$ may be the same as or different from each other and represent an aryl group, and $A^-$ represents a counter cation. The aryl group may be a carbocyclic or heterocyclic aromatic or heterocyclic aromatic (for example, an aromatic ring contains N, O, or S) group. Each aryl group may be monocyclic or polycyclic, and the boron center may have two or more single bonds with respect to the polycyclic structure (for example, biphenyl) in a case of several tetraaryl borate salts.

The triaryl alkyl borate salt is a borate salt in which one of the aryl groups is an alkyl group. As the alkyl group, an alkyl group having 1 to 20 carbon atoms is exemplified. Further, the alkyl group may be linear or branched and may have a cyclic structure.

Each aryl group may not be substituted or may be substituted with a suitable substituent in one or two or more ring positions. Suitable examples of the substituent include an alkyl group, a cycloalkyl group, a carbocyclic or heterocyclic aromatic group, a hydroxy group, a nitro group, a halogen atom, a haloalkyl group, an alkoxy group, and a haloalkoxy group.

The tetraaryl borate salt can be introduced into the image recording layer as a salt containing a suitable counter cation. The properties of the counter cation are not limited. For example, alkali metal ions such as $Li^+$, $Na^+$, and $K^-$ are suitable. Further, an ammonium cation which can be unsubstituted, primary, secondary, tertiary, or quaternary is also suitable. Suitable examples of the unsubstituted, primary, secondary, or tertiary ammonium cation include $NH_4^+$, a dimethyl ammonium cation, a diethyl ammonium cation, a triethyl ammonium cation, and a tributyl ammonium cation. A tetraphenyl borate salt having an ammonium cation is suitable as the tetraaryl borate salt.

It is preferable that the tetraaryl borate salt has a quaternary ammonium cation. The quaternary ammonium cation has a structure $[N(R^{B1})(R^{B2})(R^{B3})(R^{B4})^{+}]$, and $R^{B1}$ to $R^{B4}$ each independently represent an organic substituent. The quaternary ammonium cation permanently has an electric charge without depending on the pH of the environment.

As the quaternary ammonium cation, a quaternary alkyl ammonium cation is preferably exemplified, and a tetraethyl ammonium cation or a tetrabutyl ammonium cation is more preferably exemplified.

Among these, a tetraphenyl borate salt having a quaternary ammonium cation is particularly preferable as the borate salt.

The image recording layer may contain one or two or more borate salts.

The content of the borate salt is preferably in a range of 0.5% to 20% by mass and more preferably in a range of 1% to 10% by mass with respect to the total mass of the image recording layer.

[Low-Molecular-Weight Hydrophilic Compound]

It is preferable that the image recording layer in the planographic printing plate precursor according to the present disclosure contains a low-molecular-weight hydrophilic compound. In the present disclosure, it is preferable that the image recording layer contains a low-molecular-weight hydrophilic compound since the on-press developability can be improved without degrading the printing durability of the planographic printing plate precursor according to the present disclosure. Further, it is preferable that the low-molecular-weight hydrophilic compound is a compound having a molecular weight of less than 1,000.

The description of the low-molecular-weight hydrophilic compound is the same as the description made after the paragraph 0100 in JP2013-205569A. Among the examples, it is preferable that the image recording layer contains at least one selected from the group consisting of polyols, organic sulfates, organic sulfonates, and betaines.

Since the above-described compounds preferably exemplified as the low-molecular-weight hydrophilic compounds have a small structure of a hydrophobic portion and almost do not have a surface active action, hydrophobicity or coated-film strength of an image area is not degraded by dampening water permeating into an image recording layer exposed portion (image area) and ink receptivity or printing durability of the image recording layer can be maintained satisfactorily.

The low-molecular-weight hydrophilic compound may be used alone or in a mixture of two or more kinds thereof.

The content of the low-molecular-weight hydrophilic compound is preferably in a range of 0.5% to 20% by mass, more preferably in a range of 1% to 15% by mass, and still more preferably in a range of 2% to 10% by mass with respect to the total mass of the image recording layer. In a case where the content thereof is in the above-described range, excellent on-press developability and printing durability can be obtained.

[Oil Sensitizing Agent]

The image recording layer in the planographic printing plate precursor according to the present disclosure may contain an oil sensitizing agent.

According to the present disclosure, in order to improve the impressing property, it is preferable that the image recording layer contains an oil sensitizing agent such as a phosphonium compound, a nitrogen-containing low-molecular-weight compound, or an ammonium group-containing polymer. Particularly, in a case where a protective layer in the planographic printing plate precursor according to the present disclosure contains an inorganic layered compound, the oil sensitizing agent functions as a surface coating agent of the inorganic layered compound and prevent degradation of the impressing property due to the inorganic layered compound during the printing. A phosphonium compound, quaternary ammonium salts, and pyridinium salts are preferable. The description of suitable oil sensitizing agents is the same as the description in JP2013-205569A.

The oil sensitizing agent may be used alone or in a mixture of two or more kinds thereof.

The content of the oil sensitizing agent is preferably in a range of 0.01% to 30.0% by mass, more preferably in a range of 0.1% to 15.0% by mass, and still more preferably in a range of 1% to 5% by mass with respect to the total mass of the image recording layer.

[Other Components Constituting Image Recording Layer]

The image recording layer in the planographic printing plate precursor according to the present disclosure may contain components constituting the image recording layer other than the components described above.

Other components constituting the image recording layer are not particularly limited, and known components used for the image recording layer are exemplified. For example, the additives described in JP2013-20556A can be used as appropriate.

The content of other components constituting the image recording layer is preferably in a range of 0.01% to 20% by mass, more preferably in a range of 1% to 10% by mass, and particularly preferably in a range of 1% to 5% by mass with respect to the total mass of the image recording layer.

[Formation of Image Recording Layer]

A method of forming the image recording layer in the planographic printing plate precursor according to the present disclosure is not particularly limited, and the image recording layer can be formed using a known method. The image recording layer is formed by dispersing or dissolving each of the necessary components constituting the image recording layer in a solvent to prepare a coating solution and coating the layer with the coating solution. Preferred examples of the solvent to be used include methyl ethyl ketone, ethylene glycol monomethyl ether, 1-methoxy-2-propanol, 2-methoxy ethyl acetate, 1-methoxy-2-propyl acetate, y-butyl lactone, and the present disclosure is not limited to these.

The solvent may be used alone or in a mixture of two or more kind thereof. The concentration of solid contents in the prepared coating solution is preferably in a range of 1% to 50% by mass.

The coating amount (the total mass of the solid content) of the image recording layer is preferably in a range of 0.3 to 3.0 g/m$^2$.

Various methods can be used as the coating method. Examples thereof include a bar coater coating method, a rotary coating method, a spray coating method, a curtain coating method, a dip coating method, an air knife coating method, a blade coating method, and a roll coating method.

It is preferable that the image recording layer in the planographic printing plate precursor according to the present disclosure can be removed by any one or both of the dampening water composition and a printing ink.

<Support>

The support used for the planographic printing plate precursor according to the present disclosure is not particularly limited and may be a dimensionally stable plate-like hydrophilic support. An aluminum plate is particularly preferable as the support. The support described in JP2013-205569A can be appropriately used.

[Hydrophilic Treatment]

In the planographic printing plate precursor according to the present disclosure, it is also preferable that a hydrophilic treatment is performed on the surface of the support in order to improve the hydrophilicity of the non-image area region and prevent printing stain.

Preferred examples of the method for the hydrophilic treatment to be performed on the surface of the support include an alkali metal silicate treatment of performing an immersion treatment or an electrolytic treatment on the support in an aqueous solution such as sodium silicate; a method of treating the surface with potassium fluorozirconate, and a method of treating the surface with polyvinylphosphonic acid. In addition, a method of performing an immersion treatment on the surface in a polyvinylphosphonic acid aqueous solution is preferably used.

<Undercoat Layer>

It is preferable that the planographic printing plate precursor according to the present disclosure may be provided with an undercoat layer (also referred to as an interlayer) between the image recording layer and the support.

Since bonding of the support to the image recording layer becomes stronger in an exposed portion and the support is easily separated from the image recording layer in an unexposed portion, the undercoat layer contributes to improvement of the developability without degrading the printing durability. Further, in a case of infrared laser exposure, the undercoat layer functions as a heat insulating layer so that degradation of sensitivity due to heat, generated by exposure, being diffused in the support is prevented.

Examples of the compound used for the undercoat layer include a silane coupling agent having an ethylenically double bond reaction group, which can be added and polymerized, described in JP1998-282679A (JP-H10-282679A); and a phosphorous compound having an ethylenically double bond reaction group described in JP1990-304441A (JP-H02-304441A). More preferred examples thereof include polymer resins having an adsorptive group which can be adsorbed to the surface of the support, a hydrophilic group, and a crosslinkable group, as described in JP2005-125749A and JP2006-188038A. As such a polymer resin, a copolymer of a monomer containing an adsorptive group, a monomer containing a hydrophilic group, and a monomer containing a crosslinkable group is preferable. Specific examples thereof include a polymer resin which is a copolymer of a monomer containing an adsorptive group such as a phenolic hydroxy group, a carboxy group, —PO$_3$H$_2$, —OPO$_3$H$_2$, —CONHSO$_2$—, —SO$_2$NHSO$_2$—, or —COCH$_2$COCH$_3$, a monomer containing a hydrophilic sulfo group, and a monomer containing a polymerizable crosslinkable group such as a methacryl group or an allyl group. The polymer resin may include a crosslinkable group introduced by forming salts between a polar substituent of the polymer resin and a compound that includes a substituent having the opposite charge and an ethylenically unsaturated bond. Further, monomers other than the monomers described above, preferably hydrophilic monomers may be further copolymerized.

The content of the ethylenically unsaturated double bond in the polymer resin for an undercoat layer is particularly preferably in a range of 0.1 to 10.0 mmol and more preferably in a range of 2.0 to 5.5 mmol with respect to 1 g of the polymer resin.

The mass average molar mass (weight-average molecular weight) of the polymer resin for an undercoat layer is preferably 5,000 or greater and more preferably in a range of 10,000 to 300,000.

For the purpose of preventing stain over time, the undercoat layer may contain a chelating agent, a secondary or tertiary amine, a polymerization inhibitor, an amino group, a compound that includes an amino group or a functional group having polymerization inhibiting ability and a group interacting with the surface of an aluminum support, and the like (for example, 1,4-diazabicyclo[2,2,2]octane (DABCO), 2,3,5,6-tetrahydroxy-p-quinone, chloranil, sulfophthalic acid, hydroxyethyl ethylene diamine triacetic acid, dihydroxyethyl ethylene diamine diacetic acid, or hydroxyethyl imino diacetic acid) in addition to the compounds for an undercoat layer described above.

The undercoat layer is applied according to a known method. The coating amount (solid content) of the undercoat layer is preferably in a range of 0.1 to 100 mg/m$^2$ and more preferably in a range of 1 to 30 mg/m$^2$.

<Protective Layer>

In the planographic printing plate precursor according to the present disclosure, it is preferable that a protective layer (oxygen blocking layer) is provided on the image recording layer in order to block diffusion penetration of oxygen that disturbs a polymerization reaction during exposure.

As the material of the protective layer, any of a water-soluble polymer and a water-insoluble polymer can be appropriately selected and used, and two or more kinds thereof can be used in combination as necessary. Specific examples thereof include polyvinyl alcohol, modified polyvinyl alcohol, polyvinylpyrrolidone, a water-soluble cellulose derivative, and poly(meth)acrylonitrile. Among these, a water-soluble polymer compound having relatively excellent crystallinity is preferably used. Specifically, in a case where polyvinyl alcohol is used as a main component, this leads to excellent results particularly for basic characteristics such as oxygen blocking properties and development removability.

As the polyvinyl alcohol used for the protective layer, those described in paragraphs 0216 and 0217 in JP2013-205569A can be used as appropriate.

For the purpose of improving oxygen blocking properties or surface protection properties of the image recording layer, it is also preferable that the protective layer contains an inorganic layered compound. Among examples of the inorganic layered compound, a fluorine-based swellable synthetic mica which is a synthetic inorganic layered compound is particularly useful. Specifically, inorganic layered compounds described in JP2005-119273A are suitably exemplified.

The coating amount of the protective layer is preferably in a range of 0.05 to 10 g/m$^2$, more preferably in a range of 0.1 to 5 g/m$^2$ in a case where the protective layer contains an inorganic layered compound, and still more preferably in a range of 0.5 to 5 g/m$^2$ in a case where the protective layer does not contain an inorganic layered compound.

<Back Coat Layer>

The planographic printing plate precursor according to the present disclosure may be provided with a back coat layer on the rear surface of the support, that is, the surface on the opposite side of the surface on which the image recording layer is provided, as necessary. As the back coat layer, a coating layer formed of a metal oxide obtained by hydrolyzing and polycondensing an organic polymer compound described in JP1993-45885A (JP-H05-45885A) and an organic metal compound or an inorganic metal compound described in JP1994-35174A (JP-H06-35174A) is suitably exemplified. Among these, from the viewpoints of inexpensive raw materials and easily obtaining the raw materials, it is preferable to use an alkoxy compound of silicon such as $Si(OCH_3)_4$, $Si(OC_2H_5)_4$, $Si(OC_3H_7)_4$, or $Si(OC_4H_9)_4$.

(Plate-Making Method for Planographic Printing Plate)

It is preferable that the planographic printing plate precursor according to the present disclosure is a planographic printing plate precursor for on-press development from which a planographic printing plate can be produced by performing image-exposing and performing a development treatment through on-press development.

A planographic printing plate may be produced by image-exposing the planographic printing plate precursor according to the present disclosure and performing a development treatment through liquid development.

The plate-making method for a planographic printing plate according to the present disclosure includes an exposing step of imagewise-exposing the planographic printing plate precursor according to the present disclosure, and a developing step of supplying at least one of a printing ink or dampening water on a printing press and removing an unexposed portion of the image recording layer in the planographic printing plate precursor.

In a case of the development treatment through liquid development, the plate-making method for a planographic printing plate according to the present disclosure is a method including an exposing step of imagewise-exposing the planographic printing plate precursor according to the present disclosure, and a developing step of removing an unexposed portion of the image recording layer in the planographic printing plate precursor in the presence of a developer having a pH of 2 to 14.

Hereinafter, preferred aspects of each step in the plate-making method for a planographic printing plate according to the present disclosure will be sequentially described. Further, according to the plate-making method of a planographic printing plate according to the present disclosure, a planographic printing plate can be produced using the planographic printing plate precursor according to the present disclosure even in a case where the developing step includes a water-washing step.

<Exposing Step>

It is preferable that the plate-making method for a planographic printing plate according to the present disclosure includes an exposing step of imagewise-exposing the planographic printing plate precursor according to the present disclosure. It is preferable that the planographic printing plate precursor according to the present disclosure is image-exposed by laser exposure through a transparent original picture having a line image, a halftone image, and the like or by laser beam scanning using digital data.

The wavelength of a light source is preferably in a range of 750 to 1,400 nm. As the light source having a wavelength of 750 to 1,400 nm, a solid-state laser or a semiconductor laser that radiates infrared rays is suitable. The output of the infrared laser is preferably 100 mW or greater, the exposure time per one pixel is preferably less than 20 microseconds, and the irradiation energy quantity is preferably in a range of 10 to 300 mJ/cm$^2$. For the purpose of reducing the exposure time, it is preferable to use a multi-beam laser device. The exposure mechanism may be any of an internal drum system, an external drum system, and a flat bed system.

The image exposure can be performed using a plate setter according to a conventional method. In a case of the on-press development, the planographic printing plate precursor is mounted on the printing press, and image exposure may be performed on the printing press.

<Developing Step>

It is preferable that the plate-making method for a planographic printing plate according to the present disclosure includes a developing step of supplying at least one of a printing ink or dampening water on the printing press and removing an unexposed portion of the image recording layer in the planographic printing plate precursor. According to this aspect, it is preferable that at least dampening water is supplied.

In other words, according to the plate-making method for a planographic printing plate of the present disclosure, it is preferable that the development treatment is performed using a method (on-press development system) of performing development while at least one of dampening water or ink is added on the printing press.

Further, the development treatment may be performed using a method (developer treatment system) of performing development in a developer having a pH of 2 to 14.

Hereinafter, the on-press development system will be described below.

[On-Press Development System]

In the on-press development system, the image-exposed planographic printing plate precursor supplies at least one of oily ink or an aqueous component, preferably an aqueous component or both of oily ink and an aqueous component, and more preferably oily ink and an aqueous component on a printing press, and the image recording layer in the non-image area is removed, thereby preparing a planographic printing plate.

In other words, in a case where the planographic printing plate precursor is image-exposed and then mounted on the printing press without performing any development treatment or the planographic printing plate precursor is mounted on the printing press, image-exposed on the printing press, and supplies oily ink and an aqueous component for printing, an uncured image recording layer is dissolved or dispersed and then removed by at least one or both of the supplied oily ink and the aqueous component in a non-image area at the initial stage of printing, and the hydrophilic surface is exposed to the removed portion. In addition, in the exposed portion, the image recording layer cured due to exposure forms an oily ink receiving portion having a lipophilic surface. In place of oily ink, the aqueous component may be initially supplied to the plate surface, but it is preferable that the aqueous component is initially supplied to the plate surface from the viewpoint that the effects of the planographic printing plate precursor according to the present disclosure become significant. In this manner, the planographic printing plate precursor is subjected to on-press development on the printing press and used as it is for a plurality of sheets of printing. As the oily ink and the aqueous component, a typical printing ink for planographic printing and dampening water are suitably used.

In the plate-making method for a planographic printing plate obtained from the planographic printing plate precursor according to the present disclosure, regardless of the development system, the entire surface of the planographic printing plate precursor may be heated before exposure, during exposure, or between exposure and development as necessary. In a case where the entire surface thereof is heated, the image forming reaction in the image recording layer is promoted so that the sensitivity or the printing durability is improved and the sensitivity is stabilized. Further, in a case of the developer treatment system, it is also effective to perform post-heating or exposure of the entire surface with respect to the image which has been subjected to the development treatment for the purpose of improving the image strength or the printing durability. It is preferable that the heating before development is performed under a mild temperature condition of 150° C. or lower. In a case where the temperature is in the above-described range, a problem of a non-image area being cured can be prevented. Extremely strong conditions are used for the heating after development. The temperature is preferably in a range of 100° C. to 500° C. In a case where the temperature is in the above-described range, an image-strengthening action is sufficiently obtained, and deterioration of the support and thermal decomposition of the image area can be suppressed.

Examples

Hereinafter, embodiments of the present invention will be described in detail with reference to the following examples, but the present disclosure is not limited to these examples. Moreover, "part" and "%" are on a mass basis unless otherwise noted.

SYNTHESIS EXAMPLES

[Synthesis of Hard Polymer Particles p-1 to p-12]

—Synthesis of Hard Polymer Particles p-1—

Synthesis was performed according to the following method.

A monomer A represented by the following structural formula was synthesized according to the method described in Chemical Communications, 2007, #9 p. 954 to 956.

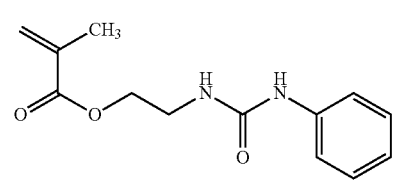

Monomer A 10 g of methoxy polyethylene glycol methacrylate (PEGMA, molecular weight of 1,000, average number of repeating units of ethylene glycol: 23), deionized water (75 g), and n-propanol (240 g) were put into a three-neck flask. This flask was gradually heated to 75° C. in a $N_2$ atmosphere. A solution obtained by mixing styrene (20 g), acrylonitrile (70 g), and AIBN (2,2-azobis(2-methylpropionitrile), 0.7 g) in advance was added to the flask for 2 hours. After 6 hours, a mixture obtained by mixing the monomer A (10 g) and AIBN (0.5 g) in advance was added dropwise thereto for 30 minutes, and the temperature of the resulting solution was increased to 80° C. Next, AIBN (0.35 g) was added to the solution for 6 hours, and the solution was allowed to react for 3 hours, thereby obtaining a dispersion liquid containing hard polymer particles p-1. The solid content in the dispersion liquid was 24.3%. In the particle size distribution of the particles, the number average primary particle diameter was 280 nm.

—Synthesis of Hard Polymer Particles p-2—

Hard polymer particles p-2 were synthesized in the same manner as that for the hard polymer particles p-1 except that the monomer A was changed to a phenyl glycidyl ether acrylate hexamethylene diisocyanate urethane prepolymer (AH-600, manufactured by KYOEISHA CHEMICAL Co., Ltd.).

—Synthesis of Hard Polymer Particles p-3—

Hard polymer particles p-3 were synthesized in the same manner as that for the hard polymer particles p-1 except that the monomer A was changed to N-phenylmaleimide.

—Synthesis of Hard Polymer Particles p-4—

Hard polymer particles p-4 were synthesized in the same manner as that for the hard polymer particles p-1 except that the monomer A was changed to N-phenylmethacrylamide.

—Synthesis of Hard Polymer Particles p-5—

Hard polymer particles p-5 were synthesized in the same manner as that for the hard polymer particles p-1 except that the monomer A was changed to 4-methacrylamide benzene sulfonamide (manufactured by Fujifilm Fine Chemicals Co., Ltd.).

—Synthesis of Hard Polymer Particles p-6—

10 g of methoxy polyethylene glycol methacrylate (PEGMA, molecular weight of 1,000, average number of repeating units of ethylene glycol: 23), deionized water (75 g), and n-propanol (240 g) were put into a three-neck flask. This flask was gradually heated to 75° C. in a $N_2$ atmosphere. A solution obtained by mixing acrylonitrile (90 g) and AIBN (0.7 g) in advance was added to the flask for 2 hours. After 6 hours, a mixture obtained by mixing the monomer A (10 g) and AIBN (0.5 g) in advance was added dropwise thereto for 30 minutes, and the temperature of the resulting solution was increased to 80° C. Next, AIBN (0.35 g) was added to the solution for 6 hours, and the solution was allowed to react for 3 hours, thereby obtaining a dispersion liquid containing hard polymer particles p-6. The solid content in the dispersion liquid was 24.3%. In the particle size distribution of the particles, the number average primary particle diameter was 320 nm.

—Synthesis of Hard Polymer Particles p-7—

Deionized water (180 g) in which polyoxyethylene alkyl sulfoammonium (HITENOL 08E, manufactured by DKS Co., Ltd.) (0.1 g) was dissolved was added to a flask provided with a stirrer, an inert gas introduction pipe, a reflux condenser, and a thermometer. A mixture obtained by mixing methyl methacrylate (16 g), the monomer A (2.0 g), trimethylolpropane trimethacrylate (2.0 g), AIBN (0.2 g), and 3,4-dinitrobenzoic acid (0.2 g), which was prepared in advance, was added to the solution, and the solution was stirred using a T. K. homogenizer (manufactured by Tokushu Kika Kogyo Co., Ltd.) at 8,000 rpm for 5 minutes to obtain a uniform suspension. Next, the suspension was heated to 75° C. while being blown by nitrogen gas and was continuously stirred at this temperature for 5 hours to cause a suspension polymerization reaction. This suspension was transferred to a beaker and heated and stirred in air, and the moisture content was volatilized until the solid content of the dispersion liquid was set to 20%, thereby obtaining a dispersion liquid (solid content of 20%) containing hard polymer particles p-7.

—Synthesis of Hard Polymer Particles p-8—

Polyoxyethylene alkyl sulfoammonium (HITENOL 08E, manufactured by DKS Co., Ltd.) (5.0 g), deionized water (75 g), and n-propanol (240 g) were put into a three-neck flask. This flask was gradually heated to 75° C. in a $N_2$ atmosphere. A solution obtained by mixing styrene (20 g), acrylonitrile (60 g), and AIBN (0.7 g) in advance was added to the flask for 2 hours. After 6 hours, a mixture obtained by mixing the monomer A (20 g) and AIBN (0.5 g) in advance was added dropwise thereto for 30 minutes, and the temperature of the resulting solution was increased to 80° C. Next, AIBN (0.35 g) was added to the solution for 6 hours, and the solution was allowed to react for 3 hours, thereby obtaining a dispersion liquid containing hard polymer particles p-8. The solid content in the dispersion liquid was 23.8%. In the particle size distribution of the particles, the number average primary particle diameter was 350 nm.

—Synthesis of Hard Polymer Particles p-9—

A monomer represented by the following structural formula was synthesized as follows. 20 g of polyethylene glycol monomethacrylate (molecular weight of 350) was added to a flask, 1.42 g of ethyl isocyanate and 0.05 g of NEOSTANN U-600 (manufactured by NITTO KASEI CO., LTD.) were added thereto, and the solution was stirred at 50° C. for 3 hours, thereby synthesizing 21.4 g of a monomer B.

Monomer B

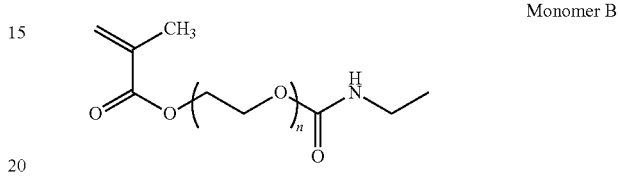

The monomer B (20.0 g), deionized water (75 g), and n-propanol (240 g) were put into a three-neck flask. This flask was gradually heated to 75° C. in a $N_2$ atmosphere. A solution obtained by mixing styrene (20 g), acrylonitrile (60 g), and AIBN (0.7 g) in advance was added to the flask for 2 hours. After 6 hours, AIBN (0.5 g) was added thereto, and the temperature of the resulting solution was increased to 80° C. Next, AIBN (0.35 g) was added to the solution for 6 hours, and the solution was allowed to react for 3 hours, thereby obtaining a dispersion liquid containing hard polymer particles p-9. The solid content in the dispersion liquid was 23.8%. In the particle size distribution of the particles, the number average primary particle diameter was 400 nm.

—Synthesis of Hard Polymer Particles p-10—

10 g of methoxy polyethylene glycol methacrylate (PEGMA, molecular weight of 2,000, average number of repeating units of ethylene glycol: 50), deionized water (75 g), and n-propanol (240 g) were put into a three-neck flask. This flask was gradually heated to 75° C. in a $N_2$ atmosphere. A solution obtained by mixing styrene (20 g), acrylonitrile (70 g), and AIBN (0.7 g) in advance was added to the flask for 2 hours. After 6 hours, AIBN (0.5 g) was added thereto, and the temperature of the resulting solution was increased to 80° C. Next, AIBN (0.35 g) was added to the solution for 6 hours. The polymerization was progressed by 98% or greater at a stage where the solution was allowed to react for 3 hours, thereby obtaining a dispersion liquid containing polymer particles p-10 (for comparison). The solid content in the dispersion liquid was 24.0%. In the particle size distribution of the particles, the number average primary particle diameter was 250 nm.

—Synthesis of Hard Polymer Particles p-11—

10 g of methoxy polyethylene glycol methacrylate (PEGMA, molecular weight of 2,000, average number of repeating units of ethylene glycol: 50), deionized water (75 g), and n-propanol (240 g) were put into a three-neck flask. This flask was gradually heated to 75° C. in a $N_2$ atmosphere. A solution obtained by mixing acrylonitrile (90 g) and AIBN (0.7 g) in advance was added to the flask for 2 hours. After 6 hours, AIBN (0.5 g) was added thereto, and the temperature of the resulting solution was increased to 80° C. Next, AIBN (0.35 g) was added to the solution for 6 hours. The polymerization was progressed by 98% or greater at a stage where the solution was allowed to react for 3 hours, thereby obtaining a dispersion liquid containing polymer particles p-11 (for comparison). The solid content in the dispersion liquid was 24.0%. In the particle size distribution of the particles, the number average primary particle diameter was 280 nm.

—Synthesis of Hard Polymer Particles p-12—

Deionized water (180 g) in which polyoxyethylene alkyl sulfoammonium (HITENOL 08E, manufactured by DKS Co., Ltd.) (0.1 g) was dissolved was added to a flask provided with a stirrer, an inert gas introduction pipe, a reflux condenser, and a thermometer. A mixture obtained by mixing methyl methacrylate (18 g), trimethylolpropane trimethacrylate (2.0 g), AIBN (0.2 g), and 3,4-dinitrobenzoic acid (0.2 g), which was prepared in advance, was added to the solution, and the solution was stirred using a T. K. homogenizer (manufactured by Tokushu Kika Kogyo Co., Ltd.) at 8,000 rpm for 5 minutes to obtain a uniform suspension. Next, the suspension was heated to 75° C. while being blown by nitrogen gas and was continuously stirred at this temperature for 5 hours to cause a suspension polymerization reaction. This suspension was transferred to a beaker and heated and stirred in air, and the moisture content was volatilized until the solid content of the dispersion liquid was set to 20%, thereby obtaining a dispersion liquid (for comparison) (solid content of 20%) containing hard polymer particles p-12.

With respect to each of the hard polymer particles p-1 to p-12 prepared in the above-described manner, groups on the surface of the polymer, which constitute the hard polymer, the coating ratio (coating ratio (%)) of the groups on the surface, the number average primary particle diameter (particle diameter (μm)), and the Rockwell hardness are listed in Table 1.

The description of the hard polymer particles p-10 to p-12 with the sign of "-" in the columns for groups on the surface means that the particles do not contain any of the urethane group, the urea group, the imide group, the amide group, and the sulfonamide group on the surface.

The coating ratio of the groups on the surface and the number average primary particle diameter were measured according to the above-described methods.

The Rockwell hardness was measured according to the method described below.

Each hard polymer particle dispersion liquid was dried in an oven at 60° C. for 16 hours to obtain hard polymer particles. A polymer piece having a size of 2 cm×2 cm×0.6 cm was prepared by press-forming the obtained hard polymer particles at an optional compression forming temperature.

First, a reference load was applied to each polymer piece using a steel ball indenter specified in ASTM D785. Next, a test load was applied thereto and then the reference load was applied again. An M scale was used as the steel ball indenter.

A difference (h) (unit: mm) in the penetration depth of the indenter used for applying the reference load two times before and after was acquired.

The Rockwell hardness was calculated using the following equation.

Rockwell hardness=130−500×(h)

TABLE 1

| Names of Hard polymer particles | Groups on the surface | Coating ratio (%) | Particle diameter | Rockwell hardness |
|---|---|---|---|---|
| Hard polymer particles p-1 | Urea | Approximately 10 | 0.28 | M75 |
| Hard polymer particles p-2 | Urethane | Approximately 10 | 0.25 | M75 |
| Hard polymer particles p-3 | Imide | Approximately 10 | 0.25 | M75 |
| Hard polymer particles p-4 | Amide | Approximately 10 | 0.27 | M75 |
| Hard polymer particles p-5 | Sulfonamide | Approximately 10 | 0.30 | M75 |
| Hard polymer particles p-6 | Urea | Approximately 10 | 0.32 | M80 |
| Hard polymer particles p-7 | Urea | Approximately 10 | 0.28 | M80 |
| Hard polymer particles p-8 | Urea | Approximately 50 | 0.35 | M75 |
| Hard polymer particles p-9 | Urethane | Approximately 50 | 0.40 | M75 |
| Hard polymer particles p-10 | — | 0 | 0.25 | M75 |
| Hard polymer particles p-11 | — | 0 | 0.28 | M80 |
| Hard polymer particles p-12 | — | 0 | 0.28 | M90 |

[Synthesis of Polymerizable Compounds m-1 to m-9]

—Synthesis of Polymerizable Compound m-1—

3.2 g of trimethyl hexamethylene diamine and 32 g of tetrahydrofuran were added to a reaction container, and the reaction container was cooled using ice water. Next, a mixed solution of 9.6 g of 1,1-(bisacryloyloxymethyl)ethyl isocyanate (KARENZ BEI, manufactured by SHOWA DENKO K. K.) and 10 g of tetrahydrofuran was added dropwise thereto for 30 minutes and stirred for 1 hour while being cooled. After the completion of the reaction was confirmed using $^1$HNMR, the solution was added dropwise to 300 g of water which was being stirred. The deposited solid was filtered and dried using a blast dryer at 40° C. for 12 hours, thereby obtaining 12.0 g of a polymerizable compound m-1.

—Synthesis of Polymerizable Compound m-2—

A polymerizable compound m-2 was synthesized according to the method described in paragraphs 0089 to 0091 in JP2010-534651A.

—Synthesis of Polymerizable Compound m-3—

A 80 mass % solution of DESMODUR N100 (an aliphatic polyisocyanate resin containing hexamethylene diisocyanate as a main agent, manufactured by Bayer AG) and urethane acrylate obtained by the reaction between hydroxyethyl acrylate and pentaerythritol triacrylate in 2-butanol was prepared and used as a polymerizable compound m-3.

—Synthesis of Polymerizable Compound m-4—

A polymerizable compound m-4 was synthesized according to the method described in paragraphs 0049 to 0071 in JP2014-118442A.

—Synthesis of Polymerizable Compound m-5—

4.2 g of 2-amino-2-ethyl-1,3-propanediol, 37 g of acetonitrile, and 3.6 g of triethylamine were added to a reaction container, and the reaction container was cooled using ice water. Next, 5.0 g of 4,4'-biphenyl sulfonyl chloride was divided and added thereto little by little for 30 minutes, and the solution was stirred for 1 hour while the container was cooled as it was. 200 g of ethyl acetate and 200 g of 1 mol/l hydrochloric acid water were added to the reaction solution to carry out a liquid separation operation, and 200 g of 1 mol/l hydrochloric acid water was added to the organic layer again to carry out a liquid separation operation. 200 g of a 10 mass % NaCl aqueous solution was added to the organic layer for liquid separation, and approximately the half of ethyl acetate in the obtained organic layer was concentrated using an evaporator. Subsequently, 100 g of hexane was added thereto for solidification, and the obtained solid was filtered. The resultant was dried using a blast dryer at 40° C. for 12 hours, 5.1 g of an obtained intermediate was put into the reaction container again, and 30 g of acetonitrile and 5.0 g of methacrylic acid chloride were added to the container. 6.0 g of triethylamine was added dropwise to the solution, which was being stirred at room temperature, for 30 minutes. The resulting solution was allowed to react at room temperature for 5 hours, and the completion of the reaction was confirmed using ¹HNMR. The obtained reaction solution was added dropwise to 300 g of water which was being stirred, and then the resulting solution was stirred for 30 minutes. The deposited solid was filtered and dissolved in 30 g of acetonitrile again, and the solution was added dropwise to 300 g of water which was being stirred. The deposited solid was filtered and dried using a blast dryer at 40° C. for 12 hours, thereby obtaining 5.0 g of a polymerizable compound m-5.

—Polymerizable Compounds m-6 to m-9—

The following commercially available products were used as the polymerizable compounds m-6 to m-9.

m-6: DENACOL ACRYLATE DA-314, manufactured by Nagase ChemteX Corporation m-7: 2,2,6,6-tetramethyl-4-piperidyl methacrylate, manufactured by Wako Pure Chemical Industries, Ltd.

m-8: A-9300, manufactured by Shin-Nakamura Chemical Co., Ltd.

m-9: ARONIX M-360, manufactured by Toagosei Co., Ltd.

Hereinafter, the structures of the polymerizable compounds m-1 to m-9 and the hydrogen bonding group contained in each polymerizable compound will be described.

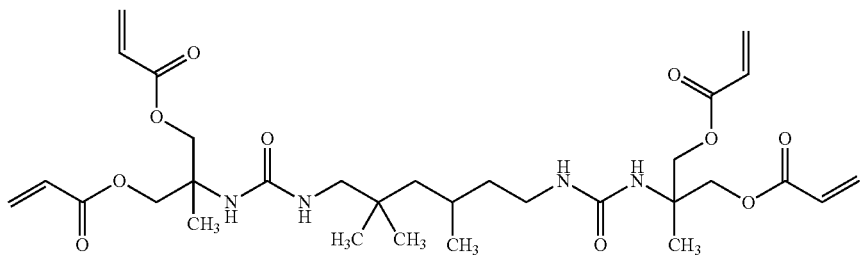

Polymerizable compound m-1
Hydrogen bonding group: urea group and ester group

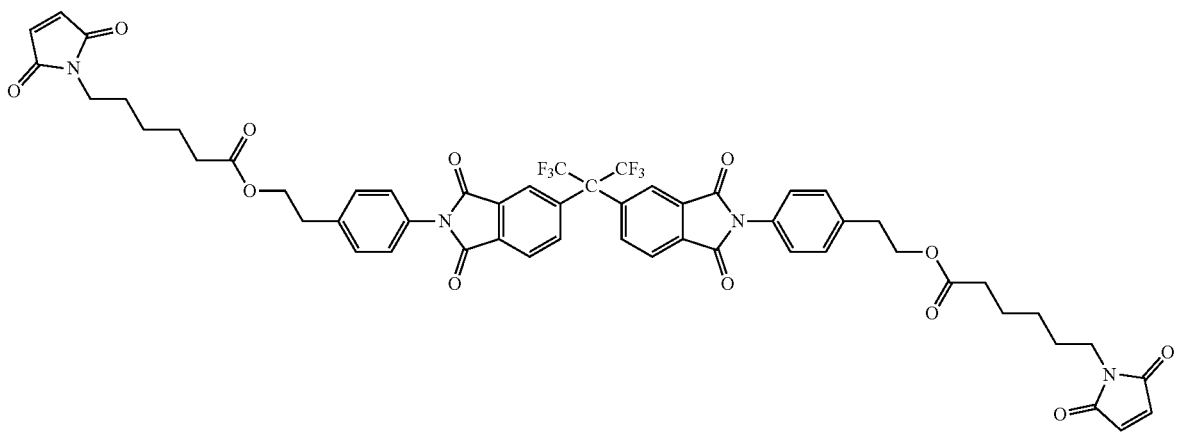

Polymerizable compound m-2
Hydrogen bonding group: imide group and ester group

-continued

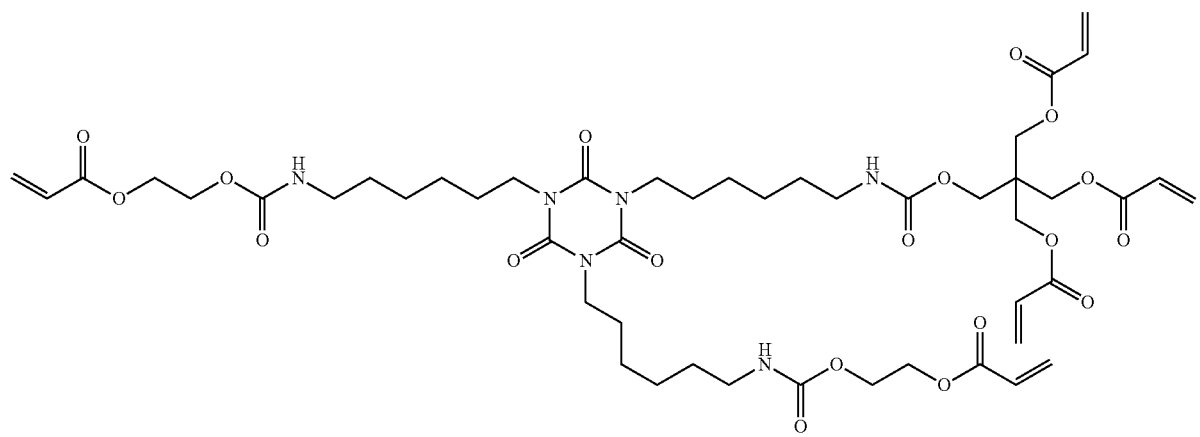

Polymerizable compound m-3
Hydrogen bonding group: urethane group and ester group

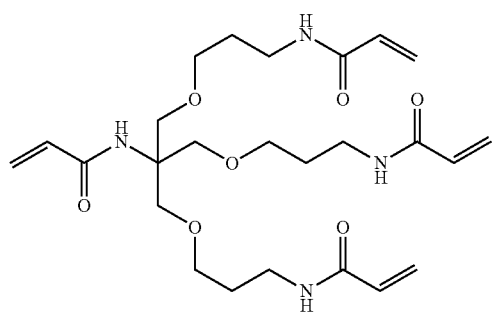

Polymerizable compound m-4
Hydrogen bonding group: amide group and ether group

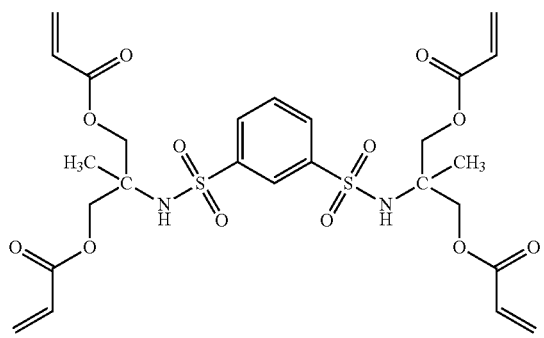

Polymerizable compound m-5
Hydrogen bonding group: sulfonamide group and ester group

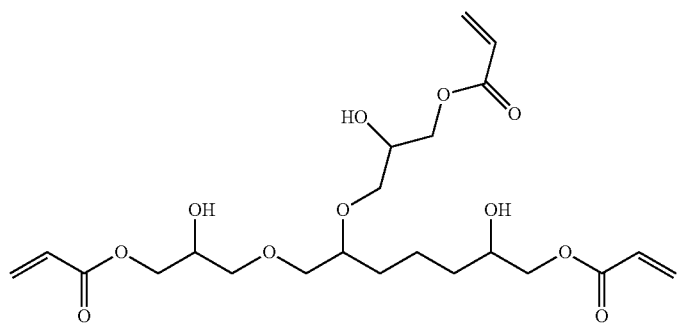

Polymerizable compound m-6
Hydrogen bonding group: hydroxy group, ether group, and ester group

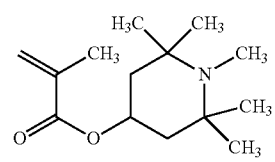

Polymerizable compound m-7
Hydrogen bonding group: amide group and ester group

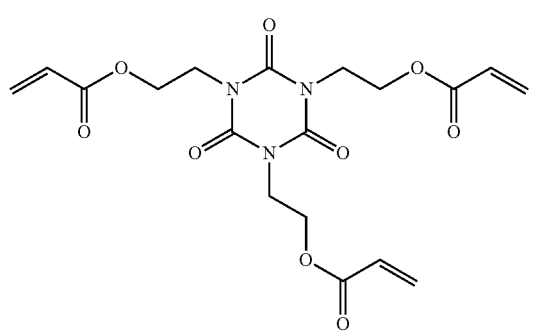

Polymerizable compound m-8
Hydrogen bonding group: ester group

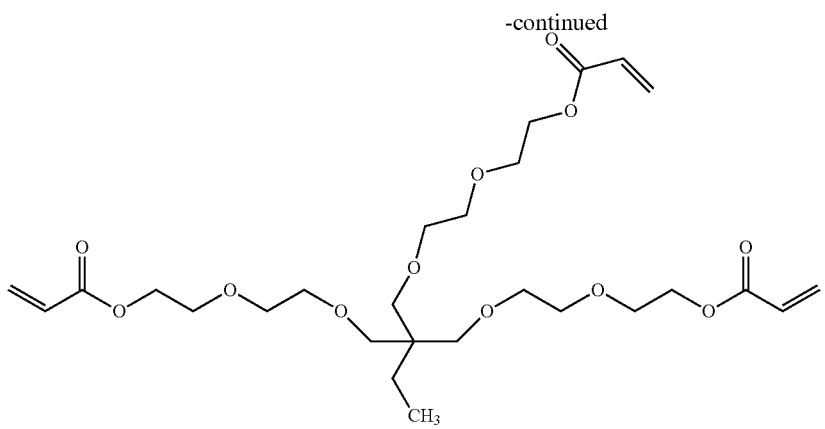

Polymerizable compound m-9
Hydrogen bonding group: ether group and ester group

Examples 1 to 34 and Comparative Examples 1 to 3

<Preparation of Planographic Printing Plate Precursor>
1. Preparation of Support (1)

An aluminum substrate which had been brush-polished, subjected to phosphoric acid anodization, and subjected to a polyacrylic acid (PAA) post-treatment according to the method described in JP2013-47004A was used as a support (1).

2. Preparation of Image Recording Layer

Respective components listed in Table 2 shown below were mixed to prepare a coating solution (1) for an image recording layer, the support (1) was coated with the coating solution using a wire bar such that the coating amount after drying the coating solution was set to 1.5 g/m$^2$, and the coating solution was dried at 115° C. for 34 seconds using a hot air dryer to form an image recording layer, thereby preparing CTP-1 to CTP-34 and CTP-1 for comparison to CTP-3 for comparison which are planographic printing plate precursors listed in Table 3.

In Table 2, the content of each active component is listed in the column of part by mass.

TABLE 2

| Components | Part by mass |
|---|---|
| Specific hard polymer particles listed in Table 3 | 13.53 |
| Polymerizable compound containing hydrogen bonding group listed in Table 3 | 2.48 |
| Binder polymer b-1 | 3.97 |
| Irgacure 250 | 0.42 |
| IR absorbing dye | 0.13 |
| Mercapto-3-triazole | 0.18 |
| BYK 336 | 0.6 |
| KLUCEL M | 3.31 |
| n-Propanol | 61.97 |
| Water | 13.41 |

The details of each component listed in Table 2 are as follows.

Binder polymer b-1: copolymer of PEGMA and allyl methacrylate

Irgacure 250: 75 mass % solution of (4-methylphenyl)[4-(2-methylpropyl)phenyl]iodonium hexafluorophosphate in propylene carbonate, manufactured by Ciba Specialty Chemicals IR absorbing dye: IR absorbing dye represented by the following formula (in the following formula, Ph represents a phenyl group)

Mercapto-3-triazole: 3-mercapto-1,2,4-triazole, manufactured by PCAS

BYK 336: modified dimethyl polysiloxane copolymer in 25% xylene/methoxypropyl acetate solution, manufactured by Byk-Chemie USA Inc.

KLUCEL M: 2% aqueous solution (viscosity: 5,000 mPa·s) of hydroxypropyl cellulose, manufactured by Hercules Inc., Aqualon Division

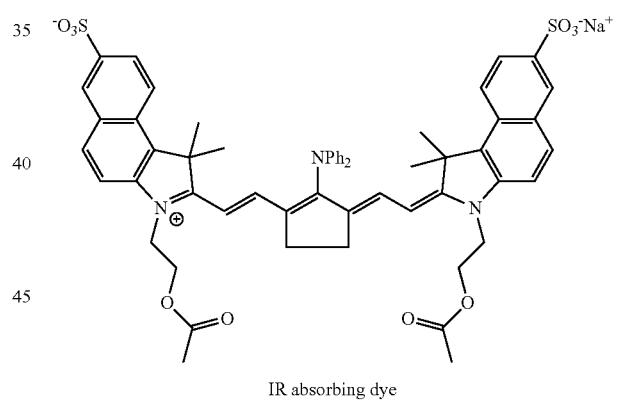

IR absorbing dye

In the prepared planographic printing plate precursors CTP-1 to CTP-34 and CTP-1 for comparison to CTP-3 for comparison, the used supports, coating solutions for an image recording layer, hard polymer particles, and polymerizable compounds containing a hydrogen bonding group are listed in Table 3.

TABLE 3

| Planographic printing plate precursor | Support | Coating solution for image recording layer | Specific hard polymer particles | Polymerizable compound containing hydrogen bonding group |
|---|---|---|---|---|
| CTP-1 | (1) | (1) | p-1 | m-1 |
| CTP-2 | (1) | (1) | p-1 | m-2 |
| CTP-3 | (1) | (1) | p-1 | m-3 |

TABLE 3-continued

| Planographic printing plate precursor | Support | Coating solution for image recording layer | Specific hard polymer particles | Polymerizable compound containing hydrogen bonding group |
|---|---|---|---|---|
| CTP-4 | (1) | (1) | p-1 | m-4 |
| CTP-5 | (1) | (1) | p-1 | m-5 |
| CTP-6 | (1) | (1) | p-1 | m-6 |
| CTP-7 | (1) | (1) | p-1 | m-7 |
| CTP-8 | (1) | (1) | p-1 | m-8 |
| CTP-9 | (1) | (1) | p-1 | m-9 |
| CTP-10 | (1) | (1) | p-2 | m-1 |
| CTP-11 | (1) | (1) | p-2 | m-2 |
| CTP-12 | (1) | (1) | p-2 | m-3 |
| CTP-13 | (1) | (1) | p-2 | m-4 |
| CTP-14 | (1) | (1) | p-2 | m-5 |
| CTP-15 | (1) | (1) | p-2 | m-6 |
| CTP-16 | (1) | (1) | p-2 | m-7 |
| CTP-17 | (1) | (1) | p-2 | m-8 |
| CTP-18 | (1) | (1) | p-2 | m-9 |
| CTP-19 | (1) | (1) | p-3 | m-1 |
| CTP-20 | (1) | (1) | p-3 | m-3 |
| CTP-21 | (1) | (1) | p-3 | m-5 |
| CTP-22 | (1) | (1) | p-3 | m-8 |
| CTP-23 | (1) | (1) | p-4 | m-1 |
| CTP-24 | (1) | (1) | p-4 | m-3 |
| CTP-25 | (1) | (1) | p-4 | m-5 |
| CTP-26 | (1) | (1) | p-4 | m-8 |
| CTP-27 | (1) | (1) | p-5 | m-1 |
| CTP-28 | (1) | (1) | p-5 | m-3 |
| CTP-29 | (1) | (1) | p-5 | m-5 |
| CTP-30 | (1) | (1) | p-5 | m-8 |
| CTP-31 | (1) | (1) | p-6 | m-1 |
| CTP-32 | (1) | (1) | p-7 | m-1 |
| CTP-33 | (1) | (1) | p-8 | m-1 |
| CTP-34 | (1) | (1) | p-9 | m-1 |
| CTP-1 for comparison | (1) | (1) | p-10 | m-3 |
| CTP-2 for comparison | (1) | (1) | p-11 | m-3 |
| CTP-3 for comparison | (1) | (1) | p-12 | m-3 |

(Evaluation of Planographic Printing Plate Precursor)

(1) Evaluation of Printing Durability

The obtained planographic printing plate precursors CTP-1 to CTP-34 and CTP-1 for comparison to CTP-3 for comparison were exposed in Trendsetter 3244VX (manufactured by Creo Co., Ltd.) equipped with a water-cooling type 40 W infrared semiconductor laser under conditions of a resolution of 175 lpi (line per inch, the number of halftone dots per inch, 1 inch is 2.54 cm), an external surface drum rotation speed of 150 rpm, and an output of 0 to 8 W by changing the range of the output by 0.15 log E. Further, the exposure was performed under conditions of a temperature of 25° C. at a relative humidity of 50% RH. The obtained planographic printing plates were printed using a printing press LITHRONE (manufactured by KOMORI Corporation), the printed material of the image area was observed, and the number of sheets (number of printed sheets) where the image started to be blurred was used as an index of the printing durability. The results are listed in Table 4.

(2) Evaluation of Scratch Resistance

The obtained planographic printing plate precursors CTP-1 to CTP-34 and CTP-1 for comparison to CTP-3 for comparison were alternately laminated with inserting paper (F inserting paper, manufactured by Daiichi Container Co., Ltd.) to prepare planographic printing plate precursor laminates. The obtained planographic printing plate precursor laminates were stacked at a height of 1 m and vibrated for 10 minutes (vibration frequency range of 5 to 55 Hz), exposure and development were performed thereon, and the state in which scratches were generated in the image area during the exposure and the development was visually evaluated. The following determination standard was used as the evaluation scale. The evaluation results are listed in Table 4.

5: No scratches were found.

4: Scratches were not able to be confirmed with naked eyes, but one scratch was able to be confirmed using a ×6 magnifying loupe.

3: Scratches were not able to be confirmed with naked eyes, but several scratches were able to be confirmed using a ×6 magnifying loupe.

2: Several scratches were able to be confirmed with naked eyes.

1: Scratches were confirmed from the entire surface.

TABLE 4

| | Planographic printing plate precursor | Evaluation results | |
|---|---|---|---|
| | | Printing durability (10,000 sheets) | Scratch resistance |
| Example 1 | CTP-1 | 5.0 | 5 |
| Example 2 | CTP-2 | 5.0 | 5 |
| Example 3 | CTP-3 | 5.0 | 5 |
| Example 4 | CTP-4 | 4.9 | 5 |
| Example 5 | CTP-5 | 4.9 | 5 |
| Example 6 | CTP-6 | 4.5 | 5 |
| Example 7 | CTP-7 | 4.5 | 4 |
| Example 8 | CTP-8 | 4.0 | 4 |
| Example 9 | CTP-9 | 4.0 | 4 |
| Example 10 | CTP-10 | 5.0 | 5 |
| Example 11 | CTP-11 | 4.9 | 5 |
| Example 12 | CTP-12 | 4.9 | 5 |
| Example 13 | CTP-13 | 4.9 | 5 |
| Example 14 | CTP-14 | 4.9 | 5 |
| Example 15 | CTP-15 | 4.5 | 4 |
| Example 16 | CTP-16 | 4.4 | 4 |
| Example 17 | CTP-17 | 4.0 | 4 |
| Example 18 | CTP-18 | 3.9 | 4 |
| Example 19 | CTP-19 | 5.0 | 5 |
| Example 20 | CTP-20 | 4.9 | 5 |
| Example 21 | CTP-21 | 4.5 | 4 |
| Example 22 | CTP-22 | 4.0 | 4 |
| Example 23 | CTP-23 | 4.9 | 5 |
| Example 24 | CTP-24 | 4.9 | 5 |
| Example 25 | CTP-25 | 4.4 | 4 |
| Example 26 | CTP-26 | 3.9 | 4 |
| Example 27 | CTP-27 | 4.9 | 5 |
| Example 28 | CTP-28 | 4.9 | 5 |
| Example 29 | CTP-29 | 4.4 | 4 |
| Example 30 | CTP-30 | 3.9 | 4 |
| Example 31 | CTP-31 | 5.0 | 5 |
| Example 32 | CTP-32 | 5.0 | 5 |
| Example 33 | CTP-33 | 5.0 | 5 |
| Example 34 | CTP-34 | 5.0 | 5 |
| Comparative Example 1 | CTP-1 for comparison | 1.1 | 1 |
| Comparative Example 2 | CTP-2 for comparison | 1.1 | 1 |
| Comparative Example 3 | CTP-3 for comparison | 1.1 | 1 |

Example 35 and Comparative Example 4

1. Preparation of Support (2)

In order to remove rolling oil on a surface of an aluminum plate (Material JIS A 1050) having a thickness of 0.3 mm, a degreasing treatment was performed using a 10 mass % sodium aluminate aqueous solution at 50° C. for 30 seconds, the aluminum surface was grained using three bundle nylon brushes having a diameter of 0.3 mm and a pumice water suspension (specific gravity of 1.1 g/cm$^3$) having a median diameter of 25 μm and then sufficiently washed with water. This aluminum plate was immersed in a 25 mass % sodium hydroxide aqueous solution at 45° C. for 9 seconds, etched, washed with water, and further immersed in 20 mass % nitric acid at 60° C. for 20 seconds, and then washed with water. The etching amount of the grained surface at this time was approximately 3 g/m².

Next, an electrochemical roughening treatment was continuously performed using an AC voltage of 60 Hz. As the electrolytic solution, a 1 mass % nitric acid aqueous solution (including 0.5% by mass of aluminum ions) was used at a liquid temperature of 50° C. Using a trapezoidal rectangular waveform AC having a time TP, until the current value reached a peak from zero, of 0.8 msec and the duty ratio of 1:1 as an AC power source waveform, the electrochemical surface-roughening treatment was performed using a carbon electrode as a counter electrode. As an auxiliary anode, ferrite was used. The current density was 30 A/dm² as the peak current value, and 5% of the current flowing from the power source was separated to an auxiliary anode. The electric quantity in the nitric acid electrolysis was 175 C/dm² in a case where the aluminum plate was an anode. Thereafter, washing with water was performed using a spray.

Next, an electrochemical roughening treatment was performed according to the same method as the method for nitric acid electrolysis under the condition of an electric quantity of 50 C/dm² in a case where an aluminum plate is an anode in a 0.5 mass % hydrochloric acid aqueous solution (including 0.5% by mass of aluminum ions) and an electrolytic solution at a liquid temperature of 50° C. Subsequently, washing with water using a spray was performed.

Next, 2.5 g/m² of a DC anodized film was provided on this aluminum plate at a current density of 15 A/dm² using 15 mass % nitric acid (including 0.5% by mass of aluminum ions) as an electrolytic solution, washed with water, and then dried, thereby preparing a support (2). The center line average roughness (Ra) of this substrate was measured using a needle having a diameter of 2 μm, and the value was 0.51 μm.

2. Application of Undercoat Layer

Next, a coating solution (1) for an undercoat layer was prepared by mixing each of the components with the following composition. The support (2) was coated with the coating solution (1) for an undercoat layer such that the drying and coating amount was set to 20 mg/m², thereby preparing a support having an undercoat layer.

[Coating Solution (1) for Undercoat Layer]

| Polymer compound A with the following structure | 0.05 parts |
| Methanol | 27 parts |
| Ion exchange water | 3 parts |

Further, each numerical value on the lower right side of parentheses representing each constitutional unit in the following polymer compound A indicates the molar ratio.

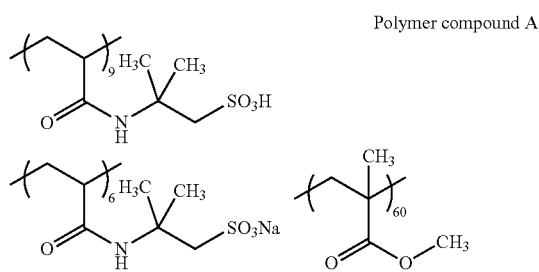

Polymer compound A

-continued

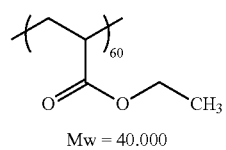

Mw = 40.000

3. Application of Image Recording Layer

Respective components listed in Table 5 were mixed to prepare a coating solution (2) for an image recording layer, the undercoat layer was coated with the coating solution using a wire bar such that the coating amount after drying the coating solution was set to 0.9 g/m², and the coating solution was dried at 115° C. for 34 seconds using a hot air dryer to form an image recording layer.

In Table 5, the content of each active component is listed in the column of part by mass.

TABLE 5

| Component | Part by mass |
|---|---|
| Specific hard polymer particles listed in Table 6 | 4.568 |
| Polymerizable compound containing hydrogen bonding group listed in Table 6 | 0.428 |
| Infrared absorbing agent IR-1 | 0.038 |
| Radical polymerization initiator S-1 | 0.061 |
| Radical polymerization initiator I-1 | 0.094 |
| Mercapto compound SH-1 | 0.015 |
| Polymerizable compound A | 0.311 |
| Polymerizable compound B | 0.250 |
| Polymerizable compound C | 0.062 |
| Auxiliary sensitizer T-1 | 0.081 |
| Polymerization inhibitor Q-1 | 0.0012 |
| Copper phthalocyanine pigment dispersion | 0.159 |
| Fluorine-based surfactant MEGAFACE F-780-F, manufactured by DIC Corporation 30 mass % methyl isobutyl ketone solution | 0.0081 |
| Methyl ethyl ketone | 5.886 |
| Methanol | 2.733 |
| 1-Methoxy-2-propanol | 5.886 |

The details of each component listed in Table 5 are as follows.

Infrared absorbing agent IR-1: compound represented by Formula IR-1

Radical polymerization initiator S-1: compound represented by Formula S-1, photopolymerization initiator Radical polymerization initiator I-1: compound represented by Formula I-1, photopolymerization initiator Mercapto compound SH-1: compound represented by Formula SH-1

Auxiliary sensitizer T-1: compound represented by Formula T-1

Polymerization inhibitor Q-1: compound represented by Formula Q-1

Copper phthalocyanine pigment dispersion: dispersion with the following composition Polymerizable compound A: compound represented by Formula B-1

Polymerizable compound B: compound represented by Formula B-2

Polymerizable compound C: compound represented by Formula B-3

In Formulae S-1 and I-1, Me represents a methyl group.

Formula IR-1

Formula S-1

Formula I-1

Formula SH-1

Formula Q-1

Formula T-1

Formula B-1

Formula B-2

Formula B-3

Further, in Formulae B-1 to B-3, each numerical value on the lower right side of parentheses representing each constitutional unit of the polymer indicates the content (molar ratio) of the constitutional unit.

—Copper Phthalocyanine Pigment Dispersion—

15 parts by mass of a copper phthalocyanine pigment, 10 parts by mass of an allyl methacrylate/methacrylic acid (80/20) copolymer as a dispersant, and cyclohexanone/methoxypropyl acetate/1-methoxy-2-propanol (15 parts by mass/20 parts by mass/40 parts by mass) as a solvent were mixed to prepare a copper phthalocyanine pigment dispersion.

4. Application of Protective Layer

[Lower Protective Layer (1)]

The surface of the image recording layer was coated with a mixed aqueous solution (coating solution (1) for a protective layer) obtained by mixing synthetic mica (SOMASIF MEB-3L, manufactured by CO-OP CHEMICAL CO., LTD., 3.2% aqueous dispersion liquid), polyvinyl alcohol (GOHSERAN CKS-50, saponification degree: 99% by mole, degree of polymerization: 300, sulfonic acid-modified polyvinyl alcohol, manufactured by Nippon Synthetic Chemical Industry Co., Ltd.), a surfactant A (EMALEX 710, manufactured by Nihon Emulsion Co., Ltd.), and a surfactant B (ADEKA PLUONIC P-84, manufactured by ADEKA CORPORATION) using a wire bar and dried at 125° C. for 30 seconds using a hot air dryer.

The content ratio of the synthetic mica (solid content)/polyvinyl alcohol/surfactant A/surfactant B in this mixed aqueous solution (coating solution (1) for a protective layer) was 7.5/89/2/1.5 (% by mass) and the coating amount (coating amount after drying) was 0.5 g/m².

[Upper Protective Layer (1)]

The surface of a lower protective layer was coated with a mixed aqueous solution (coating solution (2) for a protective layer) obtained by mixing an organic filler (ART PEARL J-7P, manufactured by Negami Chemical Industrial Co., Ltd.), synthetic mica (SOMASIF MEB-3L, 3.2% aqueous dispersion liquid, manufactured by CO-OP CHEMICAL CO., LTD.), polyvinyl alcohol (L-3266, saponification degree: 87% by mole, degree of polymerization: 300, sulfonic acid-modified polyvinyl alcohol, manufactured by Nippon Synthetic Chemical Industry Co., Ltd.), a thickener (CELLOGEN FS-B, manufactured by DKS Co., Ltd.), the polymer compound A, and a surfactant (EMALEX 710, manufactured by Nihon Emulsion Co., Ltd.) using a wire bar and dried at 125° C. for 30 seconds using a hot air dryer to prepare CTP-35 and CTP-4 for comparison which are planographic printing plate precursors listed in Table 6. The content ratio of the organic filler/synthetic mica (solid content)/polyvinyl alcohol/thickener/polymer compound A/surfactant/in this mixed aqueous solution (coating solution (2) for a protective layer) was 4.7/2.8/67.4/18.6/2.3/4.2 (% by mass) and the coating amount (coating amount after drying) was 1.8 g/m².

In the prepared planographic printing plate precursors CTP-35 to CTP-4 for comparison, the used supports, coating solutions for an undercoat layer, coating solutions for an image recording layer, hard polymer particles, polymerizable compounds containing a hydrogen bonding group, and coating solutions for a protective layer are listed in Table 6.

(Evaluation of Planographic Printing Plate Precursor)

(1) Evaluation of Printing Durability

The obtained planographic printing plate precursors CTP-35 and CTP-4 for comparison were exposed in Trendsetter 3244VX (manufactured by Creo Co., Ltd.) equipped with a water-cooling type 40 W infrared semiconductor laser under conditions of a resolution of 175 lpi, an external surface drum rotation speed of 150 rpm, and an output of 0 to 8 W by changing the range of the output by 0.15 log E. Further, the exposure was performed under conditions of a temperature of 25° C. at a relative humidity of 50% RH. After the exposure, development was performed at 30° C. for 12 seconds using a processor LP-1310 News (manufactured by Fujifilm Corporation). Further, 1:4 water dilution liquid of DH-N (manufactured by Fujifilm Corporation) was used as a developer and a 1:1 water dilution liquid of GN-2K (manufactured by Fujifilm Corporation) was used as a finisher. In addition, the obtained planographic printing plates were printed using a printing press LITHRONE (manufactured by KOMORI Corporation), the printed material of the image area was observed, and the number of sheets (number of printed sheets) where the image started to be blurred was used as an index of the printing durability. The results are listed in Table 7.

(2) Evaluation of Scratch Resistance

The obtained planographic printing plate precursors CTP-35 and CTP-4 for comparison were alternately laminated with inserting paper (F inserting paper, manufactured by Daiichi Container Co., Ltd.) to prepare planographic printing plate precursor laminates. The obtained planographic printing plate precursor laminates were stacked at a height of 1 m and vibrated for 10 minutes (vibration frequency range of 5 to 55 Hz), exposure and development were performed thereon, and the state in which scratches were generated in the image area during the exposure and the development was visually evaluated. The following determination standard was used as the evaluation scale. The evaluation results are listed in Table 7.

5: No scratches were found.

4: Scratches were not able to be confirmed with naked eyes, but one scratch was able to be confirmed using a ×6 magnifying loupe.

3: Scratches were not able to be confirmed with naked eyes, but several scratches were able to be confirmed using a ×6 magnifying loupe.

2: Several scratches were able to be confirmed with naked eyes.

1: Scratches were confirmed from the entire surface.

TABLE 6

| Planographic printing plate precursor | Support | Coating solution for undercoat layer | Coating solution for image recording layer | Specific hard polymer particles | Polymerizable compound containing hydrogen bonding group | Coating solution for protective layer | |
|---|---|---|---|---|---|---|---|
| | | | | | | Upper | Lower |
| CTP-35 | (2) | (1) | (2) | p-1 | m-1 | (2) | (1) |
| CTP-4 for comparison | (2) | (1) | (2) | p-10 | m-1 | (2) | (1) |

TABLE 7

| Planographic printing plate precursor | Evaluation results | |
| --- | --- | --- |
| | Printing durability (10,000 sheets) | Scratch resistance |
| Example 35 CTP-35 | 8.0 | 5 |
| Comparative Example 4 CTP-4 for comparison | 5.0 | 5 |

What is claimed is:

1. A planographic printing plate precursor comprising:
a support; and
an image recording layer provided on the support,
wherein the image recording layer contains an infrared absorbing agent, a polymerization initiator, a polymerizable compound containing a hydrogen bonding group, and a hard polymer particle containing at least one group selected from the group consisting of a urethane group, a urea group, an imide group, an amide group, and a sulfonamide group on the surface of the hard polymer particle,
a number average primary particle diameter of the hard polymer particle is in a range of 0.01 to 1 μm,
a coating ratio of the at least one group selected from the group consisting of the urethane group, the urea group, the imide group, the amide group, and the sulfonamide group, present on the surface of the hard polymer particle, is in a range of 1% to 99%, the coating ratio being measured by a TOF-SIMS method,
a polymer constituting the hard polymer particle comprises a polymer having any one or both of a monomer unit derived from a styrene compound and a monomer unit derived from a (meth)acrylonitrile compound, and
the at least one group selected from the group consisting of a urethane group, a urea group, an imide group, an amide group, and a sulfonamide group is a group that has been grafted by polymerizing at least one monomer selected from the group consisting of a urethane (meth) acrylate compound, a (meth)acrylate compound containing a urea group, a monomer containing an imide group, a (meth)acrylamide compound, and a monomer containing a sulfonamide group, in a presence of the polymer constituting the hard polymer particle.

2. The planographic printing plate precursor according to claim 1,
wherein the polymer comprised in the hard polymer particle further has a monomer unit derived from a poly(ethylene glycol) alkyl ether methacrylate compound.

3. The planographic printing plate precursor according to claim 1, which is used for on-press development.

4. The planographic printing plate precursor according to claim 1, wherein the at least one group selected from the group consisting of a urethane group, a urea group, an imide group, an amide group, and a sulfonamide group is a group that has been grafted by polymerizing at least one monomer selected from the group consisting of a urethane (meth) acrylate compound, a (meth)acrylate compound having a urea group, a maleimide compound, a (meth)acrylamide compound, and a (meth)acrylamide compound having a sulfonamide group, in a presence of the polymer constituting the hard polymer particle.

5. A plate-making method for a planographic printing plate comprising, in order:
a step of imagewise-exposing the planographic printing plate precursor according to claim 1; and
a step of supplying at least one of a printing ink or dampening water and removing an unexposed portion of an image recording layer in the planographic printing plate precursor.

6. A planographic printing plate precursor comprising:
a support; and
an image recording layer provided on the support,
wherein the image recording layer contains an infrared absorbing agent, a polymerization initiator, a polymerizable compound containing a hydrogen bonding group, and a hard polymer particle containing at least one group selected from the group consisting of a urethane group, a urea group, an imide group, an amide group, and a sulfonamide group on the surface of the hard polymer particle,
a number average primary particle diameter of the hard polymer particle is in a range of 0.01 to 1 μm,
a coating ratio of the at least one group selected from the group consisting of the urethane group, the urea group, the imide group, the amide group, and the sulfonamide group, present on the surface of the hard polymer particle, is in a range of 1% to 99%, the coating ratio being measured by a TOF-SIMS method,
a polymer constituting the hard polymer particle comprises a polymer having any one or both of a monomer unit derived from a styrene compound and a monomer unit derived from a (meth)acrylonitrile compound, and
the at least one group selected from the group consisting of a urethane group, a urea group, an imide group, an amide group, and a sulfonamide group is present at a side chain of a polymer present at the surface of the hard polymer particle.

* * * * *